United States Patent [19]
Okase

[11] Patent Number: 5,884,009
[45] Date of Patent: Mar. 16, 1999

[54] SUBSTRATE TREATMENT SYSTEM

[75] Inventor: Wataru Okase, Sagamihara, Japan

[73] Assignee: Tokyo Electron Limited, Tokyo-To, Japan

[21] Appl. No.: 129,752

[22] Filed: Aug. 5, 1998

[30] Foreign Application Priority Data

Aug. 7, 1997 [JP] Japan .................................. 9-225729

[51] Int. Cl.⁶ .................................................. F26B 3/30
[52] U.S. Cl. ........................... 392/418; 219/405; 392/416
[58] Field of Search .................................. 392/418, 416; 118/725; 219/390, 405

[56] References Cited

U.S. PATENT DOCUMENTS

| | | | |
|---|---|---|---|
| 5,520,742 | 5/1996 | Ohkase | 118/724 |
| 5,534,073 | 7/1996 | Kinoshita et al. | 118/728 |
| 5,578,132 | 11/1996 | Yamaga et al. | 118/724 |
| 5,581,874 | 12/1996 | Aoki et al. | 29/825 |
| 5,592,581 | 1/1997 | Okase | 392/418 |
| 5,628,859 | 5/1997 | Janin et al. | 156/273.3 |
| 5,647,945 | 7/1997 | Matsuse et al. | 156/345 |
| 5,650,082 | 7/1997 | Anderson | 219/390 |
| 5,681,614 | 10/1997 | Omori et al. | 427/248.1 |
| 5,683,518 | 11/1997 | Moore et al. | 118/730 |
| 5,710,407 | 1/1998 | Moore et al. | 219/405 |

*Primary Examiner*—Teresa Walberg
*Assistant Examiner*—Vinod D. Patel
*Attorney, Agent, or Firm*—Beveridge, DeGrandi, Weilacher & Young, LLP

[57] ABSTRACT

A heat-treatment system comprises a first vessel made of a metal, defining a processing chamber and provided in its side wall with an opening through which a wafer to be heat-treated is carried into and the heat-treated wafer is carried out of the first vessel, a second vessel made of a highly heat-resistant nonmetallic material, disposed in the processing chamber and provided in its side wall with an opening coinciding with the opening of the first vessel. A wafer support device is disposed in the processing chamber and has a wafer support table. A heating device for heating a wafer supported on the wafer support table, a process gas supply unit is disposed opposite to a wafer supported on the wafer support table. An enclosing side wall is extended from the periphery of the process gas supply unit so as to surround a processing space between the process gas supply unit and the wafer support table. The process gas supply unit is held on a level where the enclosing side wall covers the openings and define a small processing space around the wafer while the wafer is being subjected to a heat-treatment process. A purge gas is supplied into spaces between the first vessel and the second vessel to prevent the process gases from coming into contact with the first vessel made of a metal to prevent the corrosion of the first vessel.

27 Claims, 17 Drawing Sheets

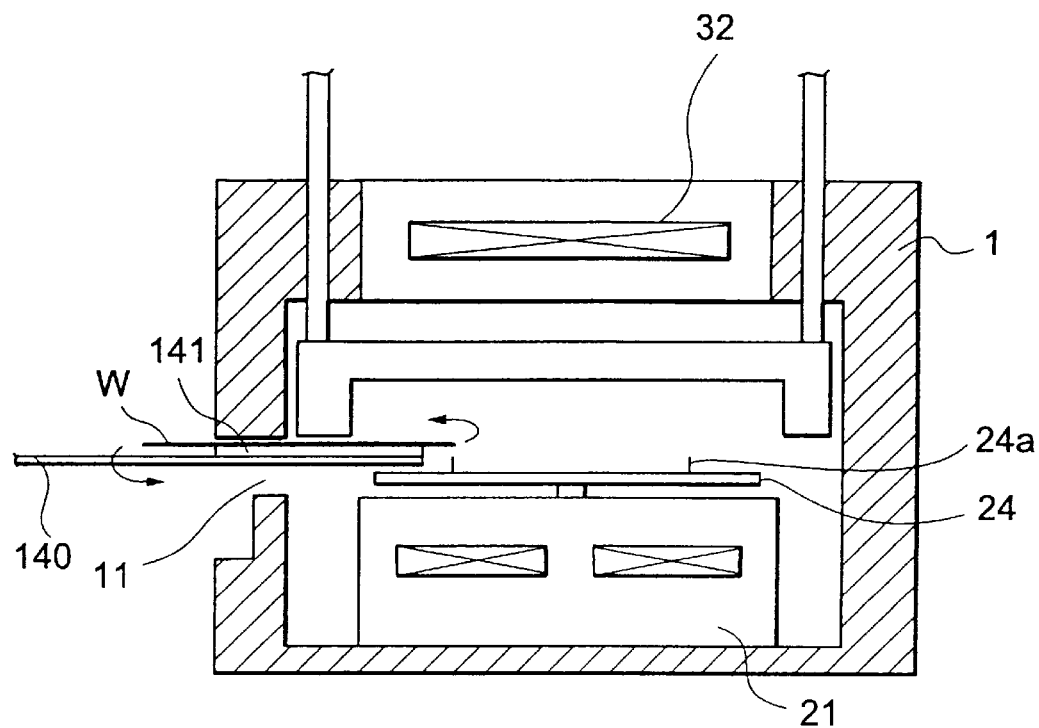
FIG.14A
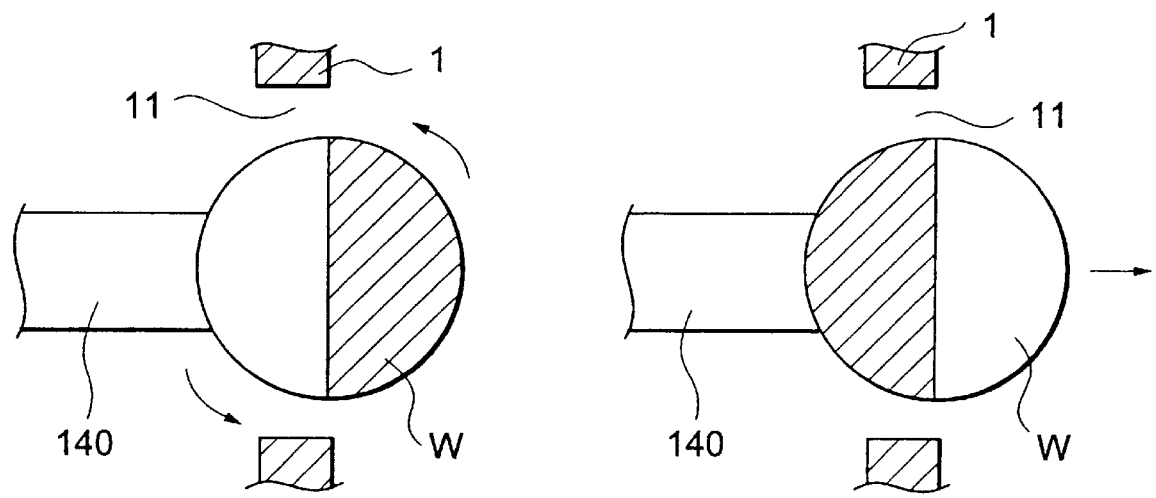
FIG.14B
FIG.14C

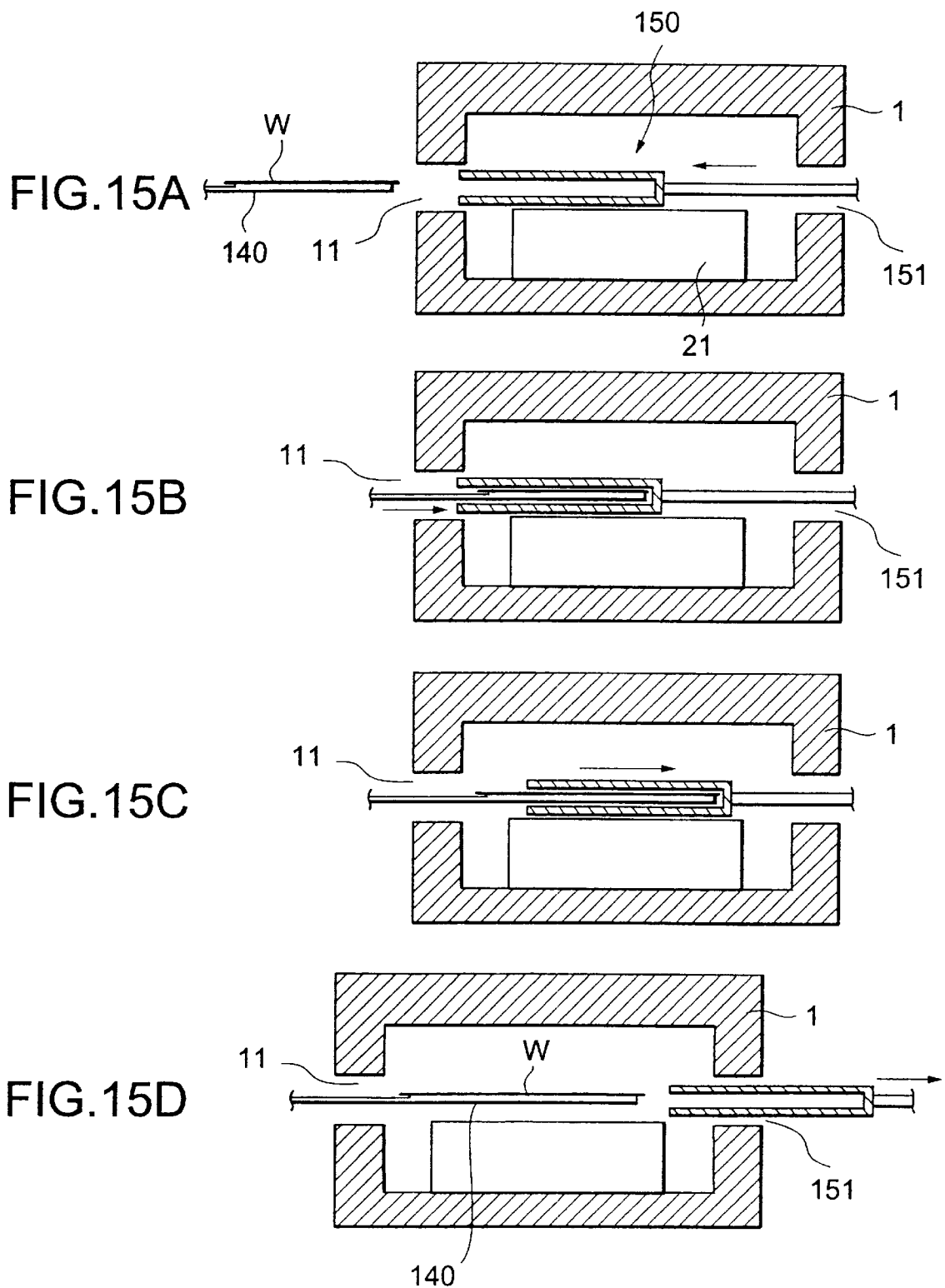

SUBSTRATE TREATMENT SYSTEM

BACKGROUND OF THE INVENTION

1. Field of the Invention

The present invention relates to a substrate treatment system, and, more particularly, to a heat-treatment system suitable for processing a substrate such as a semiconductor wafer by an oxidation process for wet oxidation, HCl oxidation or the like, and a gas-treatment system for carrying out a gas-treatment suitable for an oxidation process, a CVD process or the like.

2. Description of the Related Art

A semiconductor device fabricating method includes an oxidation process for oxidizing the surface of a silicon layer in a hot atmosphere of high temperature to form an oxide film (insulating film). A known single wafer processing heat-treatment system capable of processing a wafer by an oxidation process without significantly affecting the heat history of the wafer carries a wafer mounted on a wafer holder to a set position in a reaction tube to process wafers one at a time, and then heats the wafer rapidly.

Referring to FIG. 16 showing such a single wafer processing heat-treatment system, a vertical reaction tube 200 has a section defining a heat-treatment region and surrounded by a heat insulating structure 210. A process gas supply pipe 211 and an exhaust pipe 212 are connected to the reaction tube 200 to cause a process gas supplied into the reaction tube 200 to flow from an upper part toward a lower part of the heat-treatment region.

A wafer holder 220 is disposed in the reaction tube 200. The wafer holder 220 can be vertically moved at a speed in the range of about 150 to about 200 mm/s. A wafer transfer chamber 230 is formed under the reaction tube 200, and a wafer transfer mechanism, not shown, is disposed in the wafer transfer chamber 230. The wafer transfer mechanism puts one wafer W on the wafer holder 220 in the wafer transfer chamber 230, and then the wafer holder 220 raises the wafer W to a predetermined position. Subsequently, a heating unit 240 provided with a resistance heating device 241 and an heat equalizing member 242 heats the wafer W at a predetermined heat processing temperature, and the process gas is supplied through the process gas supply pipe 211 to process the wafer W for atmospheric pressure oxidation.

This single wafer processing heat-treatment system carries out a wet oxidation process using $H_2O$ gas or an HCl oxidation process using $O_2$ gas and HCl gas. Since HCl gas is highly corrosive and since a metal member is corroded if HCl gas is used on the metal member wet with water, the reaction tube 200 is made of quartz.

Shutters 250 are disposed between the reaction tube 200 and a vessel defining the wafer transfer chamber 230 disposed under the reaction tube 200 so as to be moved horizontally to isolate and protect the members forming the wafer transfer chamber 230 and a driving mechanism for moving the wafer holder 220 from the corrosive process gases. Semicircular cuts are formed in the shutters 250, respectively, to enable the shutters 250 come into close contact with a lifting shaft 221 for lifting the wafer holder 220. A region extending below a level corresponding to the exhaust pipe 212 and communicating with the interior of the reaction tube 200 is purged with an inert gas, such as $N_2$ gas.

When processing a wafer W by this heat-treatment system, the wafer W is carried into the reaction tube 200 from below the reaction tube 200. Therefore, the wafer transfer chamber 230, the shutters 250 and the driving mechanism for driving the wafer holder 220 must be disposed below the reaction tube 200, and the heating unit 240 and the heat insulating structure 210 must be arranged outside the reaction tube 200, which inevitably increases the size of the heat-treatment system. Since the reaction tube 200 has a large processing region, the operation for changing the process gas takes much time, which reduces the throughput of the heat-treatment system.

There has been known a heat-treatment system which has a small chamber provided with a heating means like the chamber of a single wafer processing CVD system, and a wafer transfer mechanism capable of carrying a wafer into and out of the chamber through a side wall of a vessel defining the chamber. A single wafer processing CVD system will briefly be described with reference to FIG. 17. Referring to FIG. 17, a cylindrical vessel 260 made of a metal defines a processing chamber and has a side wall provided with an opening 261 through which a wafer is carried into and carried out of the processing chamber. The opening 261 is closed by a gate valve 270. A support table 280 internally provided with a heater is disposed in the bottom region of the processing chamber defined by the cylindrical vessel 260. A heating device 290 is disposed above the support table 280 in the cylindrical vessel 260.

Since the opening 261 through which a wafer W is carried into and carried out of the processing chamber is formed on one side of a processing region as shown in FIG. 18, the condition of a space surrounding the wafer W is affected by the opening 261, and uniformity in heat radiation with respect to the circumference of the wafer W is deteriorated. In a process which subjects the wafer W to a high process temperature, such as an oxidation process, the adverse effect of the deterioration of uniformity in heat radiation is significant and uniformity in oxidation in the surface of the wafer W is deteriorated even if the wafer W is rotated during the oxidation process. Since the cylindrical vessel 260 defining the processing chamber is made of a metal, the cylindrical vessel 260 is corroded if a corrosive process gas is used for the oxidation process.

SUMMARY OF THE INVENTION

The present invention has been made in view of the foregoing problems in the prior art and it is therefore an object of the present invention to provide a substrate treatment system capable of processing a workpiece for uniform heat-treatment, having metal components protected from corrosion, small in size and capable of processing workpieces at a high throughput.

Another object of the present invention is to provide a substrate processing system capable of processing a workpiece for a uniform gas-treatment.

According to a first aspect of the present invention, a substrate treatment system comprises a vessel defining a processing chamber and provided in its side wall with an opening through which a wafer to be treated is carried into and the heat-treated wafer is carried out of the vessel; a wafer support device disposed in the processing chamber defined by the vessel, and having a wafer support table for supporting a wafer thereon in a substantially horizontal attitude on the wafer support table; a heating device for heating a wafer supported on the wafer support table of the wafer support device; a process gas supply unit disposed opposite to a surface to be treated of the wafer supported on the wafer support table of the wafer support device, and capable of being vertically moved and of supplying process gases toward the wafer; and an enclosing side wall extending from the periphery of the process gas supply unit so as to surround a processing space between the process gas supply unit and the wafer support table of the wafer support device; wherein the process gas supply unit is held on a first level where the enclosing side wall does not cover the opening when the wafer is carried into and carried out of the processing chamber, and is held on a second level where the enclosing side wall covers the opening and surrounds the wafer while the wafer is being subjected to a treatment process.

According to a second aspect of the present invention, a heat-treatment system comprises a first vessel made of a metal, defining a processing chamber and provided in its side wall with an opening through which a wafer to be heat-treated is carried into and the heat-treated wafer is carried out of the first vessel; a second vessel made of a highly heat-resistant nonmetallic material, disposed in the processing chamber and provided in its side wall with an opening coinciding with the opening of the first vessel; a wafer support device disposed in the processing chamber defined by the first vessel, and having a wafer support table for supporting a wafer thereon in a substantially horizontal attitude; a heating device for heating a wafer supported on the wafer support table of the wafer support device; a process gas supply unit disposed opposite to a surface to be treated of the wafer supported on the wafer support table of the wafer support device, and capable of being vertically moved and of supplying process gases including a corrosive gas toward the wafer; an enclosing side wall extended from the periphery of the process gas supply unit so as to surround a processing space between the process gas supply unit and the wafer support table of the wafer support device; and a purge gas supply system for supplying a purge gas into at least either a space between the first vessel and the second vessel or a space between the first vessel and the enclosing side wall to prevent the process gasses from coming into contact with the first vessel made of a metal; wherein the process gas supply unit is held on a first level where the enclosing side wall does not cover the openings when the wafer is carried into and carried out of the processing chamber, and is held on a second level where the enclosing side wall covers the openings and surrounds the wafer while the wafer is being subjected to a treatment process.

The substrate treatment system according to the second aspect of the present invention is suitable for carrying out a heat-treatment process using a corrosive gas.

In the substrate treatment system according to the second aspect of the present invention, a flow control member may be provided between the inner surface of the first vessel and the wafer support table of the wafer support device so as to surround the wafer support table so that the flow control member and the enclosing side wall overlap each other with respect to a radial direction when the process gas supply unit is at a second position for supplying process gases to form a purge gas flow region in a space defined by the overlapping parts of the flow control member and the enclosing side wall and a space outside the flow control member and to form a process gas flow region inside the overlapping parts of the flow control member and the enclosing side wall. The overlapping parts of the enclosing side wall and the flow control member form labyrinths.

The heat-treatment system is provided with a process gas exhaust duct in a lower region of the interior of the first vessel, and a purge gas exhaust duct formed on an outer side of the process gas exhaust duct in the lower region of the interior of the first vessel.

Preferably, a process gas supply passage is formed in a lifting shaft for vertically moving the process gas supply unit. This construction is applicable also to the substrate treatment system according to the first aspect of the present invention. A process gas supply passage connected to the process gas supply unit and a purge gas supply passage may separately be formed in the lifting shaft for vertically moving the process gas supply unit.

The wafer support device may be vertically moved instead of vertically moving the process gas supply unit.

According to a third aspect of the present invention, a substrate treatment system comprises a first vessel made of a metal, defining a processing chamber and provided in its side wall with an opening through which a wafer to be heat-treated is carried into and the heat-treated wafer is carried out of the first vessel; a second vessel made of a heat-resistant nonmetallic material, disposed in the processing chamber and provided with an opening coinciding with the opening of the first vessel in its side wall, and exhaust holes; a wafer support device disposed in the processing chamber defined by the first vessel, and having a wafer support table for supporting a wafer thereon in a substantially horizontal attitude, capable of being vertically moved; a heating device for heating a wafer supported on the wafer support table of the wafer support device; a process gas supply unit disposed opposite to a surface to be treated of a wafer supported on the wafer support table of the wafer support device, and capable of supplying process gases including a corrosive gas toward the wafer; and a purge gas supply system for supplying a purge gas into a space between the first vessel and the second vessel to prevent the process gasses from coming into contact with the first vessel made of a metal; wherein component members placed in the second vessel are made of a heat-resistant nonmetallic material, the wafer support table of the wafer support device is disposed at a position on the same level as that of the opening or at a position away from the process gas supply unit with respect to the level of the opening when the wafer is carried into and carried out of the second vessel, and the wafer support table is at a position nearer to the process gas supply unit with respect to the opening while the wafer is subjected to a treatment process.

In the substrate treatment system according to the third aspect of the present invention, a flow control member may be disposed between the inner surface of the inner vessel and the wafer support device so as to surround the wafer support device to form a purge gas circulating region outside the flow control member and a process gas circulating region inside the flow control member. The exhaust holes are a process gas exhaust hole and a purge gas exhaust hole formed in the outer side of the process gas exhaust hole.

A substrate treatment system may be provided with a gas supply/exhaust device capable of supplying gases and exhausting the gases, and a wafer support unit having a wafer support table may be disposed with the wafer support table located close to the gas supply/exhaust device to form a narrow processing space.

According to a fourth aspect of the present invention, a substrate treatment system comprises a vessel, defining a processing chamber and provided in its side wall with an opening through which a wafer to be treated is carried into and the treated wafer is carried out of the first vessel; a wafer support device disposed in the processing chamber defined by the first vessel, and having a wafer support table for supporting a wafer thereon in a substantially horizontal attitude; a heating device for heating a wafer mounted on the wafer support table of the wafer support device; and a gas supply/exhaust unit having gas supply holes facing a surface to be treated of the wafer mounted on the wafer support table of the wafer support device, and gas exhaust holes formed in its circumferential part; wherein the wafer support table of the wafer support device is separated from the gas supply/exhaust unit so that the respective circumferential parts of the wafer support table and the gas supply/exhaust unit are separated from each other when a wafer is carried into and carried out of the processing chamber, the wafer support table of the wafer support device is positioned close to the gas supply/exhaust unit so that the respective circumferential parts of the wafer support table and the gas supply/exhaust unit overlap each other with respect to the radial direction of the processing chamber so as to form labyrinths, and process gases supplied through the gas supply holes flow through the labyrinths and are exhausted through the exhaust holes.

In the substrate treatment system according to the fourth aspect of the present invention, the vessel defining the processing chamber is made of a metal, and the component members of the wafer support device and the gas supply/exhaust unit are made of a heat-resistant nonmetallic material, and a purge gas supply system is employed to supply a purge gas into a space between the vessel and the gas supply/exhaust unit and a space between the vessel and the wafer support table of the wafer support device to avoid exposing the vessel made of a metal to the process gases including a corrosive gas.

If the process gases include water vapor, it is preferable to employ a temperature regulating means for regulating the temperature of the inner surface of the metal vessel at a temperature not lower than the dew point of the water vapor. The heat-resistant nonmetallic material may be, for example, quartz or silicon carbide. The heating device may be disposed either above or below the support surface of the wafer support table, a wafer temperature regulating device may be disposed opposite to the heating device with respect to the support surface of the wafer support table. When a wafer is carried into the processing chamber, the wafer temperature regulating device may heat the wafer at a temperature lower than a processing temperature, and then may heat the same at the processing temperature.

According to a fifth aspect of the present invention, a substrate treatment system comprises a vessel defining a processing chamber and provided in its side wall with an opening through which a wafer is carried into and carried out of the processing chamber; a wafer support device disposed in the processing chamber, and having a wafer support table for supporting a wafer thereon in a substantially horizontal attitude; a heating device for heating a wafer supported on the wafer support table of the wafer support device; a process gas supply unit for supplying process gases toward a wafer supported on the wafer support table; a carrying means for carrying a wafer into the processing chamber and transferring the wafer to the wafer support table; and a wafer turning means for turning a wafer through an angle of 180° in a period between a time point when at least a part of the wafer is inserted in the processing chamber and a time point when the same part of the wafer reaches a position corresponding to the wafer support device.

The wafer turning means of the substrate treatment system in the fifth aspect of the present invention avoids exposing a part of the wafer carried earlier into the processing chamber longer to a heating atmosphere than a part of the same carried layer into the processing chamber so that all the parts of the wafer are exposed evenly to the heating atmosphere.

According to a sixth aspect of the present invention, a substrate treatment system comprises a vessel defining a processing chamber and provided in its side wall with an opening through which a wafer to be treated is carried into the processing chamber and the treated wafer is carried out of the processing chamber; a wafer support device disposed in the processing chamber, and having a wafer support table for supporting a wafer thereon in a substantially horizontal attitude; a heating device for heating a wafer held by the wafer support device; a process gas supply unit for supplying process gases toward a wafer held by the wafer support device; a carrying means for carrying a wafer into the processing chamber and transferring the wafer to the wafer support device; a heat shielding member capable of covering at least a surface of a wafer facing the heating device and of moving together with the carrying means while the wafer is carried in the processing chamber by the carrying means before processing.

According to a seventh aspect of the present invention, a substrate treatment system comprises a vessel defining a processing chamber; a wafer support device disposed in the processing chamber, and having a wafer support table for supporting a wafer thereon; a process gas supply unit for supplying process gases toward a wafer supported on the wafer support table of the wafer support device; a heating device disposed outside the vessel so as to be opposite to at least either one or the other of the major surfaces of a wafer supported on the wafer support table to heat the wafer by radiation heat; and a quartz window disposed between a wafer supported on the wafer support table and the heating device, incorporated into the vessel and curved so as to be convex away from the wafer supported on the wafer support table; wherein a wafer supported on the wafer support table is subjected to a treatment process in a vacuum atmosphere created by evacuating the processing chamber defined by the vessel.

This substrate treatment system is suitable for processing a wafer in a vacuum atmosphere.

According to an eighth aspect of the present invention, a substrate treatment system comprises a vessel defining a processing chamber; a wafer support device disposed in the processing chamber, and having a wafer support table for supporting a wafer thereon; a process gas supply unit for supplying process gases toward a wafer supported on the wafer support table of the wafer support device; a heating device disposed outside the vessel so as to be opposite to at least either one or the other of the major surfaces of a wafer supported on the wafer support table to heat the wafer by radiation heat; and a window disposed between a wafer supported on a wafer supported on the wafer support table and the heating device, incorporated into the vessel and curved so as to be convex toward a wafer supported on the wafer support table of the wafer support device; wherein the a wafer supported on the wafer support table of the wafer support device is subjected to a treatment process in a pressurized atmosphere created in the processing chamber defined by the vessel.

This treatment system is suitable for processing a wafer in a pressurized atmosphere.

A gas-treatment system according to a ninth aspect of the present invention is suitable for uniformly processing a surface of a wafer. This gas processing system may be used in combination with any one of the foregoing substrate treatment systems according to the present invention.

The gas-treatment system according to the ninth aspect of the present invention comprises a vessel defining a processing chamber and provided in its side wall with an opening through which a wafer is carried into and carried out of the processing chamber; a wafer support device disposed in the processing chamber, and having a wafer support table for supporting a wafer thereon in a substantially horizontal attitude; and a gas supply/exhaust unit disposed opposite to a surface to be treated of a wafer held by the wafer support device to supply and exhaust process gases; wherein the gas supply/exhaust unit has a plurality of gas flow regions, some of the gas flow regions serve as gas supply regions and the rest serve as gas exhaust regions, the function of the gas flow regions serving as the gas supply regions and that of the rest serving as the gas exhaust regions are replaced with each other to change the flow of process gases during heat-treatment.

According to a tenth aspect of the present invention, a gas-treatment system comprises a vessel defining a processing chamber; a wafer support device disposed in the processing chamber defined by the vessel, and having a wafer support table for supporting a wafer thereon; and a gas supply unit disposed opposite to the wafer support table of the wafer support device and provided with a plurality of gas supply openings to supply process gases toward a wafer supported on the wafer support table of the wafer support device; wherein process gasses are supplied through the gas supply openings corresponding to a radially outer region of the surface of a wafer supported on the wafer support table of the wafer support device at a flow rate lower than that at which the process gases are supplied through the gas supply openings corresponding to a radially inner region of the surface of the wafer supported on the wafer support table of the wafer support device.

The above and other objects, features and advantages of the present invention will become more apparent from the following description taken in connection with the accompanying drawings.

BRIEF DESCRIPTION OF THE DRAWINGS

FIGS. 14A and 14C are a vertical sectional view and plan views of a wafer, respectively, of assistance in explaining a method of carrying a wafer by a transfer arm provided with a wafer turning mechanism;

FIGS. 15A, 15B, 15C and 15D are sectional views of assistance in explaining steps of a method of carrying a wafer using a heat shielding member;

DESCRIPTION OF THE PREFERRED EMBODIMENTS (First Embodiment)

Figure 1:
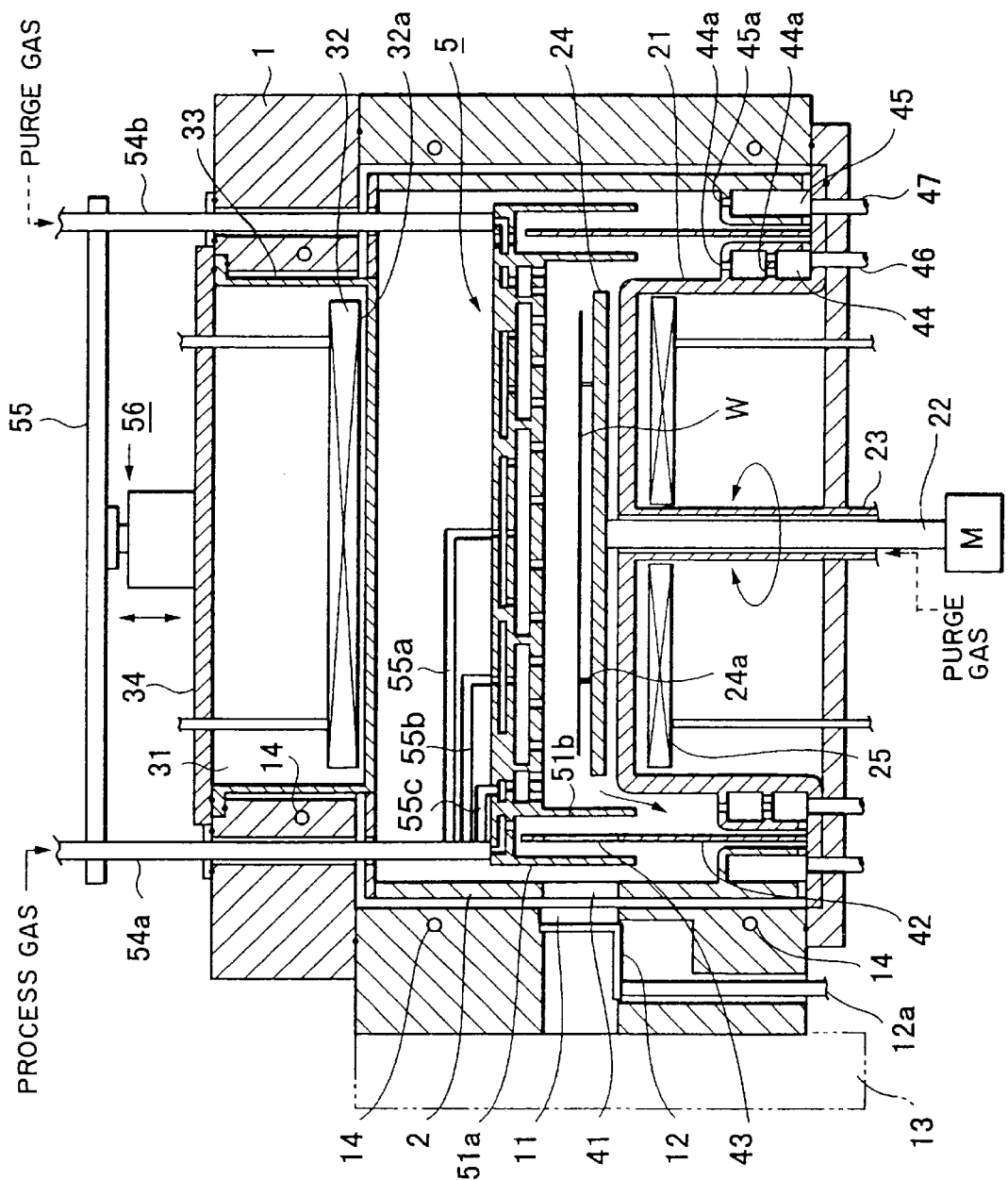
FIG. 1 is a vertical sectional view of a heat-treatment system as an example of the substrate treatment system in a first embodiment according to the present invention.

A heat-treatment system in a first embodiment according to the present invention is an oxidation system. Referring to FIG. 1, the oxidation system has a substantially cylindrical first vessel 1 of a metal defining a processing chamber and provided in its side wall with an opening 11 through which a semiconductor wafer (hereinafter referred to simply as "wafer") W is carried into and carried out of the processing chamber. Normally, the opening 11 is closed by a shutter 12. The shutter 12 is moved upward to close the opening 11 and downward to open the opening 11 by an operating shaft 12a. A gate valve 13 indicated by alternate long and short dash line is disposed beside the shutter 12 and is connected to the side wall of the vessel 1.

A substantially cylindrical second vessel 2 of a highly heat-resistant nonmetallic material, such as quartz, is fitted in the first vessel 1 so as to cover the inner surface of the first vessel 1. The second vessel 2 has a bottom wall having a central cylindrical protuberance 21. A temperature controller 25 is contained in the space defined by and separated from a processing atmosphere by the central cylindrical protuberance 21. A shaft 22 is extended through a tubular projection 23 extended vertically downward from a substantially central part of the upper wall of the central cylindrical protuberance 21. An upper end part of the shaft 22 projects slightly from the upper wall of the central cylindrical protuberance 21, and a wafer support table 24, such as a quartz plate, is attached to the upper end of the shaft 22.

The upper surface of the wafer support table 24 serves as a support surface. Formed on the support surface of the wafer support table 24 are, for example, three projections 24a to support a wafer W in a substantially horizontal attitude thereon. A lower end part of the shaft 22 extends vertically downward through the bottom wall of the second vessel 2. The lower end of the shaft 22 is coupled with the output shaft of a motor M disposed below the first vessel 1. A purge gas supply system, not shown, supplies a purge gas into the space between the shaft 22 and the tubular projection 23.

Figure 2:
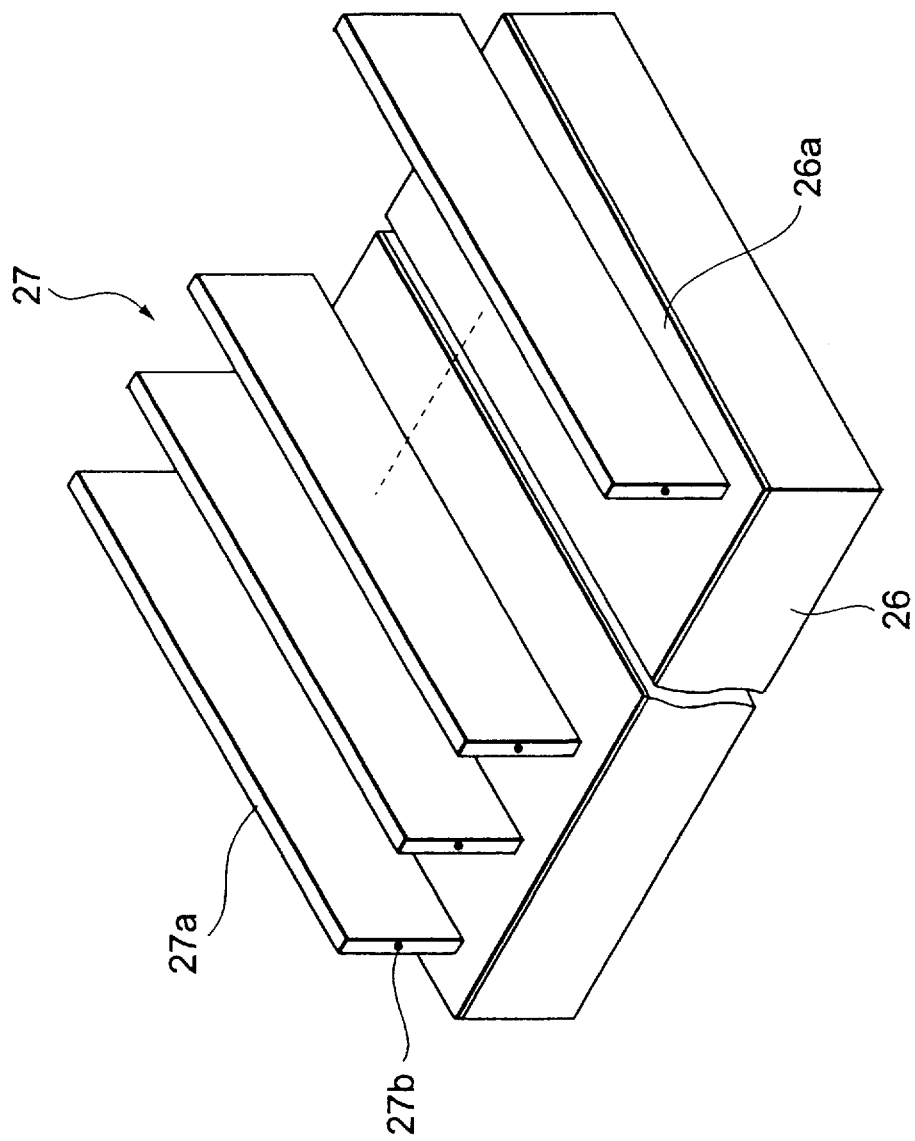
FIG. 2 is a perspective view of a temperature controller employed in the heat-treatment system of FIG. 1.

The temperature controller 25 is disposed in the space defined by the central cylindrical protuberance 21 to control the temperature of a wafer in process. As shown in FIG. 2, the temperature controller 25 comprises, in combination, a heating unit 26 including a resistance heating element, and a cooling unit 27 provided above the heating unit 26. For example, the cooling unit comprises a plurality of cooling plates 27a, through which a refrigerant can be circulated, arranged at intervals and supported for turning on horizontal shafts 27b, respectively. The cooling plates 27a can be turned on the shafts 27b to set the same either in a substantially vertical position as shown in FIG. 2 or in a substantially horizontal position so as to cover the upper surface of the heating unit 26. A silicon carbide plate (SiC plate) 26a forms the upper wall of the heating unit 26. The SiC plate 26a inhibits the leakage of metal components such as sodium included in the heat insulating material of the heating unit 26, into the processing atmosphere.

A large circular opening 31 is formed in a central part of the upper wall of the first vessel 1. A heating device 32 including, for example, a resistance heating element is disposed above the upper wall of the second vessel 2 opposite to the wafer support table 24. An SiC plate 32a is interposed between the heating device 32 and the upper wall of the second vessel 2. The circumference of the circular opening 31 of the upper wall of the first vessel 1 is covered with a cylindrical member 33 of quartz. The cylindrical member 33 is connected to the upper wall of the second vessel 2. The circular opening 31 is covered with a metal plate 34. The second vessel 2 is provided in its side wall with an opening 41 positioned so as to coincide with the opening 11 of the first vessel 1.

A process gas supply unit 5 is disposed opposite to the support surface of the wafer support table 24 in the second vessel 2. As shown by way of example in FIGS. 1 and 3, the process gas supply unit 5 is constructed by arranging a first disk 5a, a second disk 5b of the same size as that of the first disk 5a, and a third disk 5c slightly greater in diameter than the wafer support table 24 in descending order at intervals, covering the circumferences of the first disk 5a and the second disk 5b with a first side wall 51a, covering the space between the second disk 5b and the third disk 5c with a second side wall 51b joined to the circumference of the third disk 5c. An upper space is formed between the first disk 5a and the second disk 5b, and a lower space is formed between the second disk 5b and the third disk 5c. The upper space is divided diametrically into three zones, i.e., a first zone Z1, a second zone Z2 and a third zone Z3, by a partition member 53a. The lower space is divided diametrically into three zones, i.e., a first zone Z1, a second zone Z2 and a third zone Z3, by a partition member 53b. The first zone Z1 of the lower space corresponds substantially to a central area of a wafer W supported on the wafer support table 24, having a radius equal to half the radius of the wafer W. The third zone Z3 of the lower space corresponds to a space radially outside the circumference of the wafer W supported on the wafer support table 24. The second zone Z2 extends between the first zone Z1 and the third zone Z3. The upper space has a fourth zone Z4 extending outside the third zone Z3. The second disk 5b is provided with gas supply holes 52a to supply process gases into the upper space. The third disk 5c is provided with gas supply holes 52b. The second disk 5b is provided with gas supply holes 52a opening into the fourth zone Z4 and into a space inside a flow control member 43, which will be described later.

The process gas supply unit 5 can be vertically moved between a first position and a second position. The process gas supply unit 5 is held at the first position when a wafer W is carried into or carried out of the first vessel 1. The process gas supply unit 5 is held at the second position when a wafer W is subjected to an oxidation process (heat-treatment process). The process gas supply unit 5 is suspended by two hollow lifting shafts 54a and 54b connected to the upper surface of the first disk 5a. The lifting shafts 54a and 54b are extended vertically upward through the upper wall of the first vessel 1 and are connected to a horizontal support member 55. the support member 55 is moved vertically by a lifting mechanism 56 to move the process gas supply unit 5 between the first and the second position.

A first process gas supply pipe 55a, a second process gas supply pipe 55b and a third process gas supply pipe 55c are extended through the lifting shaft 54a, and are connected to the first zone Z1, the second zone Z2 and the third zone Z3 of the upper space, respectively. Flow rates of a process gas in the first process gas supply pipe 55a, the second process gas supply pipe 55b and the third process gas supply pipe 55c decreases in that order. Therefore, the flow rate of the process gases flowing through the gas supply holes 52b formed in a part of the third disk 5c nearer to the center of the third disk 5c is greater than that of the process gases flowing through the gas supply holes 52b formed in a part of the third disk 5c nearer to the circumference of the third disk 5c.

A purge gas supply pipe 55d is extended through the lifting shaft 54b and is connected to the third zone Z3 and the fourth zone Z4 of the upper space of the process gas supply unit 5. The purge gas supply pipe 55d is provided with an opening, not shown, for supplying a purge gas into a space between the lower surface of the upper wall of the first vessel 1 and the upper surface of the second vessel 2.

Figure 3:
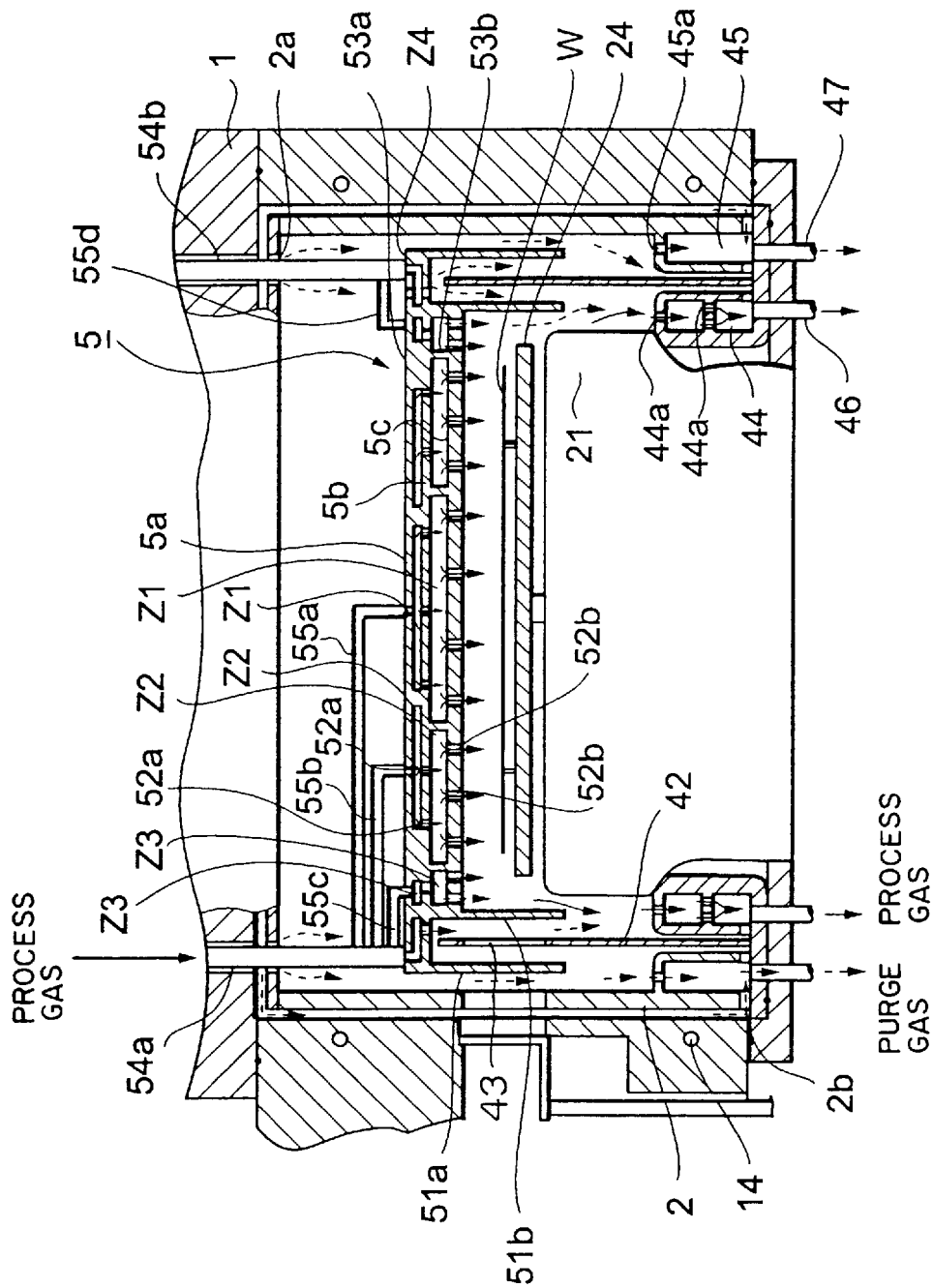
FIG. 3 is a vertical sectional view of the heat-treatment system of FIG. 1, showing the flow of process gases and a purge gas.

As shown in FIG. 3, the respective lower ends of the first side wall 51a and the second side wall 51b are on a level slightly below the level of the upper surface of the central cylindrical protuberance 21, and the second side wall 51b surrounds a processing space between the process gas supply unit 5 and the wafer support table 24 when the process gas supply unit 5 is held at the second position. The respective lower ends of the side walls 51a and 51b are on a level above the level of a wafer passage along which a wafer W is carried into and carried out of the second vessel 2 through the opening 41 to avoid obstructing the movement of the wafer W when the process gas supply unit 5 is at the first position.

The cylindrical flow control member 42 is set on the bottom wall of the second vessel 2 so as to surround the central cylindrical protuberance 21. The flow control member 42 has a height exceeding the height of the upper edge of the opening 41 and is provided with an opening 43 corresponding to the opening 41. When the process gas supply unit 5 is at the second position, the upper part of the flow control member 42 extends in a space between the first side wall 51a and the second side wall 51b, so that the flow control member 42, the first side wall 51a and the second side wall 51b overlap each other with respect to a radial direction to form labyrinths.

A process gas exhaust duct 44 having upper and lower chambers is formed contiguously with the outer circumference of the side wall of the central cylindrical protuberance 21 and the inner surface of the bottom wall of the first vessel 1. A purge gas exhaust duct 45 is formed contiguously with the inner circumference of the side wall of the second vessel 2 and the inner surface of the bottom wall of the first vessel 1. The exhaust ducts 44 and 45 communicates with a process gas exhaust pipe 46 and a purge gas exhaust pipe 47 by means of passages formed through the bottom wall of the first vessel 1, respectively. The exhaust pipes 46 and 47 are connected to exhaust pumps, not shown.

The process gas exhaust duct 44 is provided with exhaust holes 44a to suck process gases from the processing chamber defined by the first vessel 1, and the purge gas exhaust duct 44 is provided with exhaust holes 45a to suck a purge gas from the processing chamber. Exhaust holes 2b are formed in a lower part of the side wall of the second vessel 2 to suck a purge gas from a space between the first vessel 1 and the second vessel 2 into the purge gas exhaust duct 45. The components of the process gas supply unit 5, the flow control member 42, the exhaust ducts 44 and 45 arranged inside the second vessel 2 are made of, for example, quartz. Refrigerant passages 14 are formed in the walls of the first vessel 1 to keep the inner surfaces of the walls of the first vessel 1 at temperatures above the dew point of the gas filling the processing chamber defined by the first vessel 1. If steam is used in an oxidation process, the steam condenses in water drops on the inner surfaces of the first vessel 1 and hydrogen chloride gas exists in the first vessel 1, the wall of the first vessel made of a metal will be corroded. Therefore, the inner surfaces of the walls of the first vessel 1 must be kept at temperatures above the dew point of the gas filling the processing chamber defined by the first vessel 1 to avoid the corrosion of the first vessel 1.

Figure 4A:
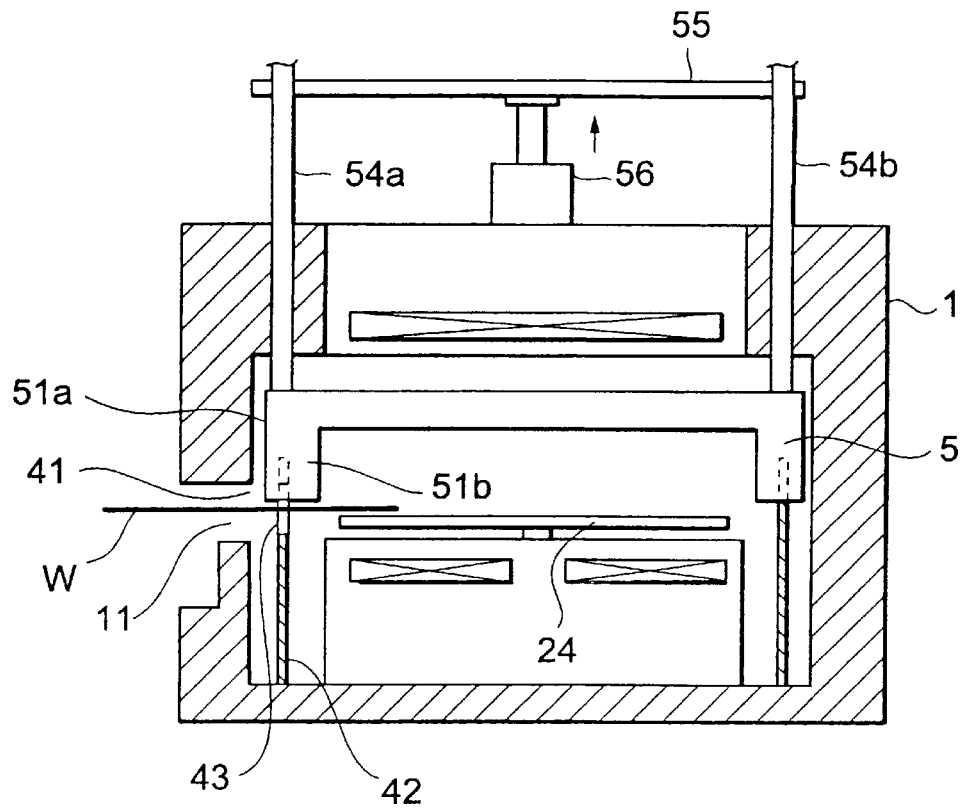
FIGS. 4A and 4B are schematic sectional views for assistance in explaining operations of the heat-treatment system of FIG. 1.
Figure 4B:
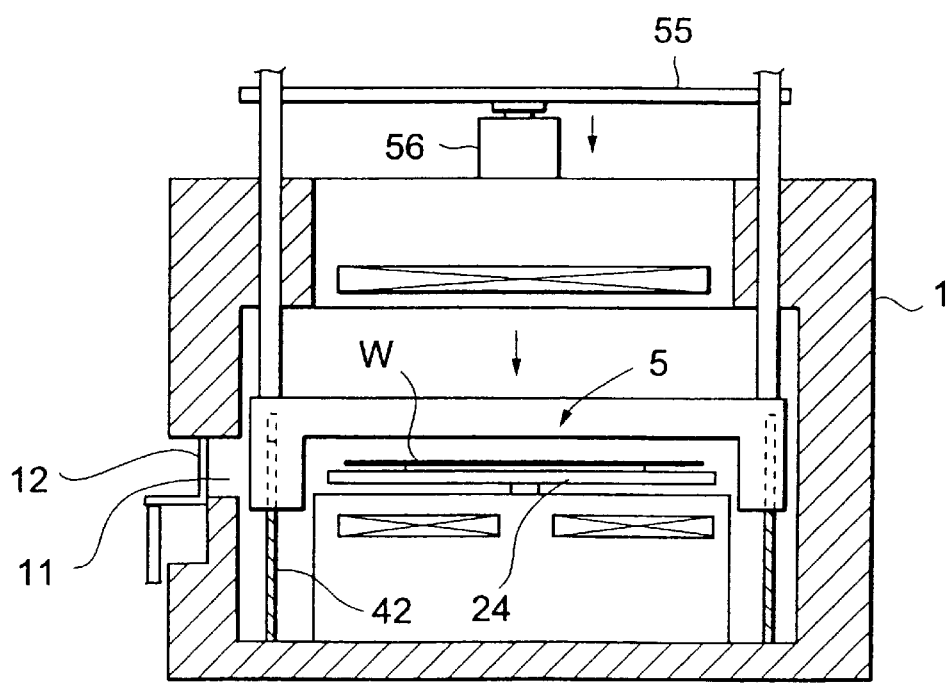

An oxidation process to be carried out by the oxidation system will be described hereafter. Referring to FIG. 4A, the process gas supply unit is raised to the first position to position the lower ends of the first side wall 51a and the second side wall 51b above the passage along which a wafer W is moved through the opening 11 corresponding to the opening 43 of the flow control member 42. Then the shutter 12 is lowered to open the opening 11, a wafer W is carried through the opening 41 of the second vessel 2, the opening 43 of the flow control member 42 into the processing chamber and is placed on the projections 24a of the wafer support table 24. In FIGS. 4A and 4B, an assembly of the first vessel and the second vessel 2 is represented by the first vessel 1.

Referring to FIG. 4B, the opening 11 is closed by the shutter 12, the process gas supply unit 5 is lowered to the second position, and the opening 43 of the flow control member 42 is covered with the first side wall 51a and the second side wall 51b to surround the wafer W by the process gas supply unit 5 and the wafer support table 24. Then an oxidation process is started. In the oxidation process, the wafer W is heated from below by radiation heat generated by the heating unit 26 of the temperature controller 25 and from above by radiation heat generated by the heating device 32 at a temperature, for example, on the order of 1000° C. The interior of the first vessel 1 is evacuated through the exhaust pipes 46 and 47 at a low vacuum in the range of, for example, 760 to 100 Torr. After the surface of the wafer W has been heated at a predetermined processing temperature, the process gas supply unit 5 supplies process gases, such as HCl gas and $O_2$ gas, at predetermined flow rates, and supplies a purge gas, such as nitrogen gas, to form a desired oxide film over the surface of the wafer W.

Figure 5A:
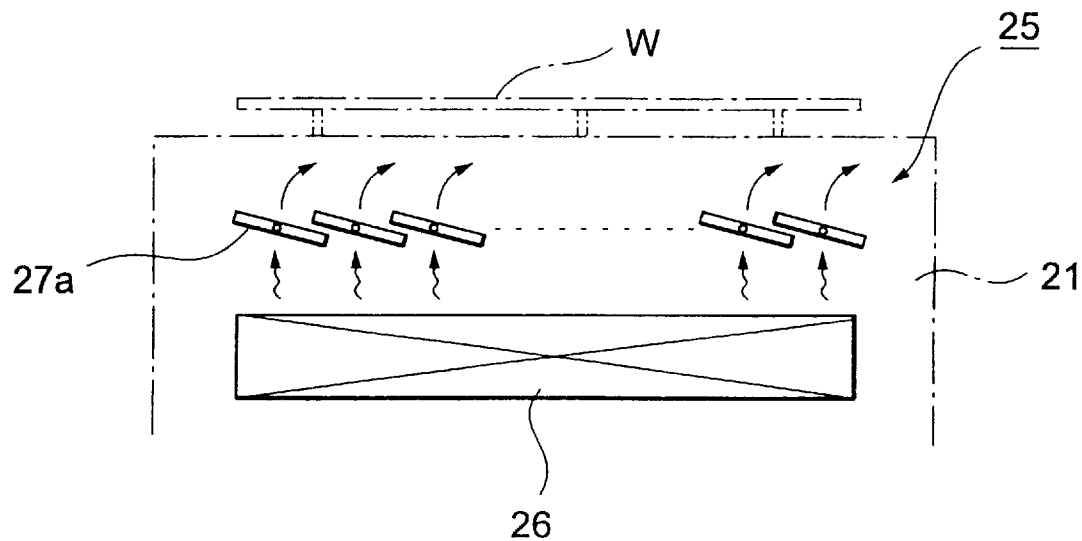
FIGS. 5A and 5B are schematic side views for assistance in explaining operations of the temperature controller of FIG. 2.

The temperature controller 25 controls the temperature of the wafer W so that the wafer W is heated first for preparatory heating at a temperature, such as about 600° C., lower than the processing temperature and then heated at the processing temperature to prevent the cracking and slipping (minute cracking) of the wafer W. For example, a temperature control method drives both the heating unit 26 and the heating device 32 for heating, sets the cooling plates 27a in a horizontal attitude as shown in FIG. 5A to intercept radiation heat radiated by the heating unit 26, and heats the surface of the wafer W at about 600° C. by the heating effect of the heating device 32 and the temperature controller 25.

Figure 5B:
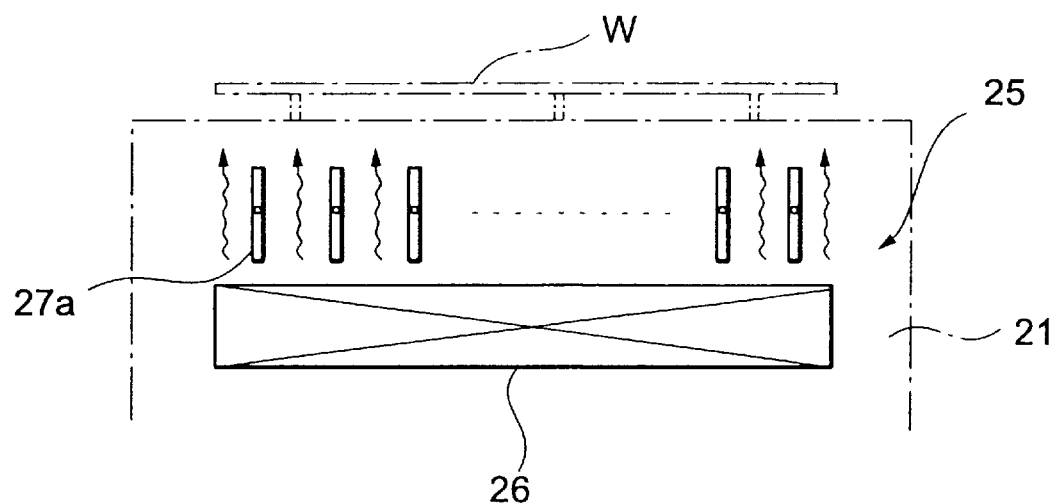

After the preparatory heating has been completed, the cooling plates 27a are set in a vertical attitude as shown in FIG. 5B to enable radiation heat radiated by the heating unit 26 to reach the wafer W, and then the surface of the wafer W is heated at about 1000° C. by both the heating device 32 and the temperature controller 25. A plurality of temperature sensors, such as five temperature sensors, are attached to the lower surface of the wafer support table 24 for temperature measurement, and the temperature controller 25 and the heating device 32 are controlled on the basis of signals provided by the temperature sensors.

The flows of the process gases and the purge gas in the first vessel 1 will be explained with reference to FIG. 3. In FIG. 3, solid lines with arrow head indicate the flows of the process gases, and broken lines with arrow head indicate the flows of the purge gas. The process gases are supplied through the three process gas supply pipes 55a, 55b and 55c into the three corresponding zones Z1, Z2 and Z3 of the process gas supply unit 5. The process gasses supplied into the first vessel 1 are caused to flow downward by the exhaust action of the exhaust pipes 46 and 47 connected to the bottom wall of the first vessel 1. The process gases supplied into the zones Z1, Z2 and Z3 diffuse in the upper space, flow through the gas supply holes 52a into the lower space, diffuse in the lower space, and flow through the gas supply holes 52b into the processing space surrounding the surface of the wafer W. Then, the process gases flow radially outward of the surface of the wafer W and toward the exhaust duct 44, flow through the exhaust holes 44a into the exhaust duct 44, and is exhausted through the exhaust pipe 46.

The purge gas is supplied through the purge gas supply pipe 55d into the third zone Z3 and the fourth zone Z4 of the upper space of the process gas supply unit 5, and is supplied also into the space between the upper wall of the first vessel 1 and the upper surface of the second vessel 2 through the opening formed in the purge gas supply pipe 55d. The purge gas flows also through the gap between the tubular projection 23 and the shaft 22 into the first vessel 1.

The purge gas supplied through the third zone Z3 of the process gas supply unit 5 and the gas supply holes 52b flows radially outward from a space around the circumference of the wafer support table 24. The purge gas supplied through the fourth zone Z4 and the gas supply holes 52a flows along the outer and the inner circumference of the flow control member 42. The purge gas supplied into the space between the first vessel 1 and the second vessel 2 flows downward through the space, and through the small gaps 2a around the lifting shafts 54a and 54b into the first vessel 1, and flows downward along the outer circumference of the flow control member 42. Part of the purge gas supplied into the first vessel 1 flows together with the process gases through the exhaust holes 44a into the process gas exhaust duct 44, and the rest of the purge gas flows through the exhaust holes 45a into the purge gas exhaust duct 45. Thus the purge gas is exhausted through the exhaust pipes 46 and 47. The purge gas supplied into the space between the first vessel 1 and the second vessel 2 flows through the exhaust holes 2b into the purge gas exhaust duct 45 and is exhausted through the exhaust purge pipe 47.

The first side wall 51a, the second side wall 51b and the flow control member 42 are arranged in the first vessel 1, the process gas exhaust pipe 46 is connected to the bottom wall of the first vessel 1 so as to correspond to the space inside the flow control member 42, and the purge gas exhaust pipe 47 is connected to the bottom wall of the first vessel 1 so as to correspond to the space outside the flow control member 42. Therefore, the space on the inner side of the second side wall 51b serves as a process gas flow space, and spaces between the first side wall 51a and the flow control member 42, between the second side wall 51b and the flow control member 42 and surrounding the first side wall 51a serve as a purge gas flow space. Thus, the flow of the process gases and that of the purge gas are separated from each other.

Since the overlapping parts of the first side wall 51a, the second side wall 51b and the flow control member 42 separate the process gas flow space and the purge gas flow space from each other, and form the labyrinths, it is difficult for the purge gas to flows radially outward beyond the labyrinths. Consequently, the escape of the purge gas through the opening 41 from the second vessel 2 can be suppressed. Although both the process gases and the purge gas are supplied to the third zone Z3, the oxidation process will not be affected by the purge gas because the third zone Z3 extends outside a region corresponding to the periphery of the wafer W held on the wafer support table 24.

The process gas supply unit 5 controls the flow of the process gases so that the flow rate of the process gases flowing through the gas supply holes 52b formed in a part of the third disk 5c nearer to the center of the third disk 5c is greater than that of the process gases flowing through the gas supply holes 52b formed in a part of the third disk 5c nearer to the circumference of the third disk 5c. Consequently, an oxide film can be formed in a uniform thickness on the surface of the wafer W. Since the process gases supplied into the first vessel 1 flow from the central region of the processing chamber corresponding to the central region of the wafer W via a region corresponding to the peripheral part of the wafer W toward the process gas exhaust duct 44, the concentration of the process gasses in the region corresponding to the peripheral part of the wafer W becomes greater than that of the same in the region corresponding to the central part of the wafer W and, consequently, the thickness of a part of the oxide film corresponding to the peripheral part of the wafer W becomes greater than that of a part of the oxide film corresponding to the central part of the wafer W if the process gases were supplied at the same flow rate through all the process gas supply holes 52b. The flow of the process gasses may be controlled so that the process gasses are supplied into the region corresponding to the peripheral part of the wafer W at a flow rate lower than that at which the process gases are supplied into the regions corresponding to the central part of the wafer W by, for example, properly distributing process gas supply holes of different diameters in the third disk 5c.

The heat-treatment system in the first embodiment uses the first vessel 1 provided with the heating device 32 and the wafer W is carried through the opening 11 formed in the side wall of the first vessel 1. Therefore, the heat-treatment system in the first embodiment can be constructed in a small size as compared with an equivalent known heat-treatment system. The process gas supply unit 5 is lowered to the second position and a relatively small processing space surrounding the wafer W is formed for a heat-treatment process by the wafer support table 24, the central cylindrical protuberance 21, the third disk 5c of the process gas supply unit 5 and the second side wall 51b. Therefore time necessary for replacing the atmosphere filing the processing chamber with the process gases can be reduced, so that the heat-treatment system is able to operate at an improved throughput.

Figure 6:
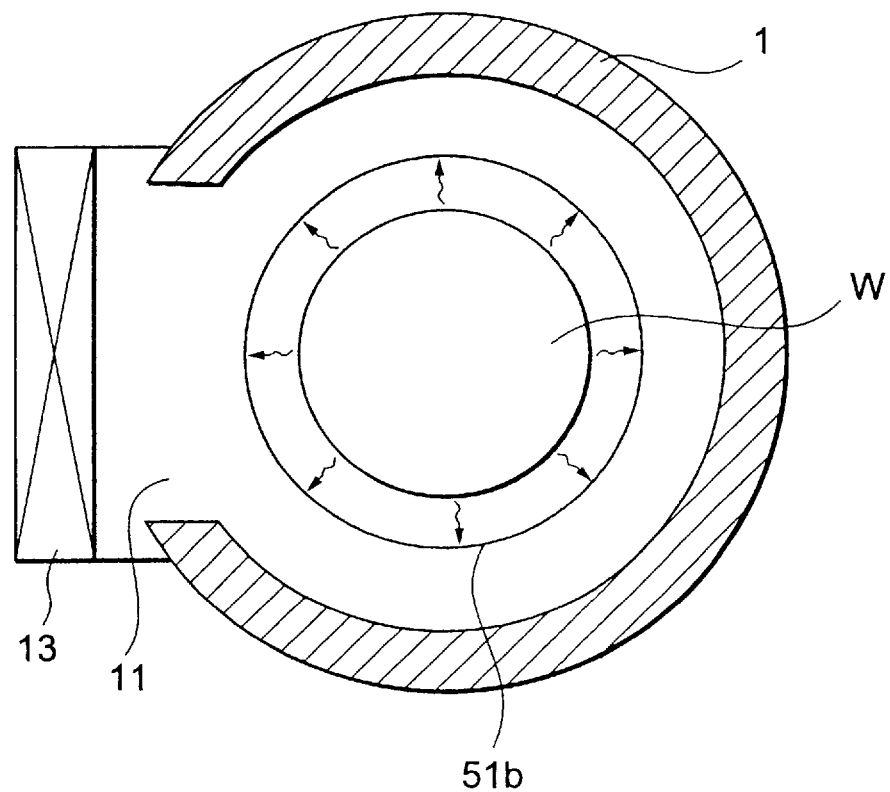
FIG. 6 is a schematic sectional view for assistance in explaining a mode of heat radiation in which a wafer radiates heat.

Since the wafer W placed in the processing chamber is surrounded by the second side wall 51b as shown in FIG. 6 during the heat-treatment process, the environmental condition of the wafer W during the heat-treatment process is isotropic in all radial directions even if the opening 11 is formed on one side of the processing region. Therefore, the surface of the wafer W can be highly uniformly subjected to the heat-treatment process.

The second vessel 2 made of quartz is placed in the first vessel 1 of a metal to cover the inner surfaces of the first vessel 1 with quartz, and the purge gas is supplied into the gap between the first vessel 1 and the second vessel 2, and the respective flows of the process gases and the purge gas are controlled so that it is difficult for the process gases to flow outside the second vessel 2. Therefore, the possibility of contact of the process gases with the inner surfaces of the first vessel 1 is suppressed. Accordingly, the corrosion of the first vessel 1 can be suppressed even if highly corrosive HCl gas is used as a process gas.

The process gas supply unit 5 may be disposed in a bottom region in the first vessel 1, the wafer support table 24 may be disposed in an upper region in the first vessel 1, a wafer W may be put on the wafer support table 24 with the process gas supply unit 5 held at a first position, and the process gas supply unit 5 may be moved up to a second position for a heat-treatment process.

(Second Embodiment)

Figure 7:
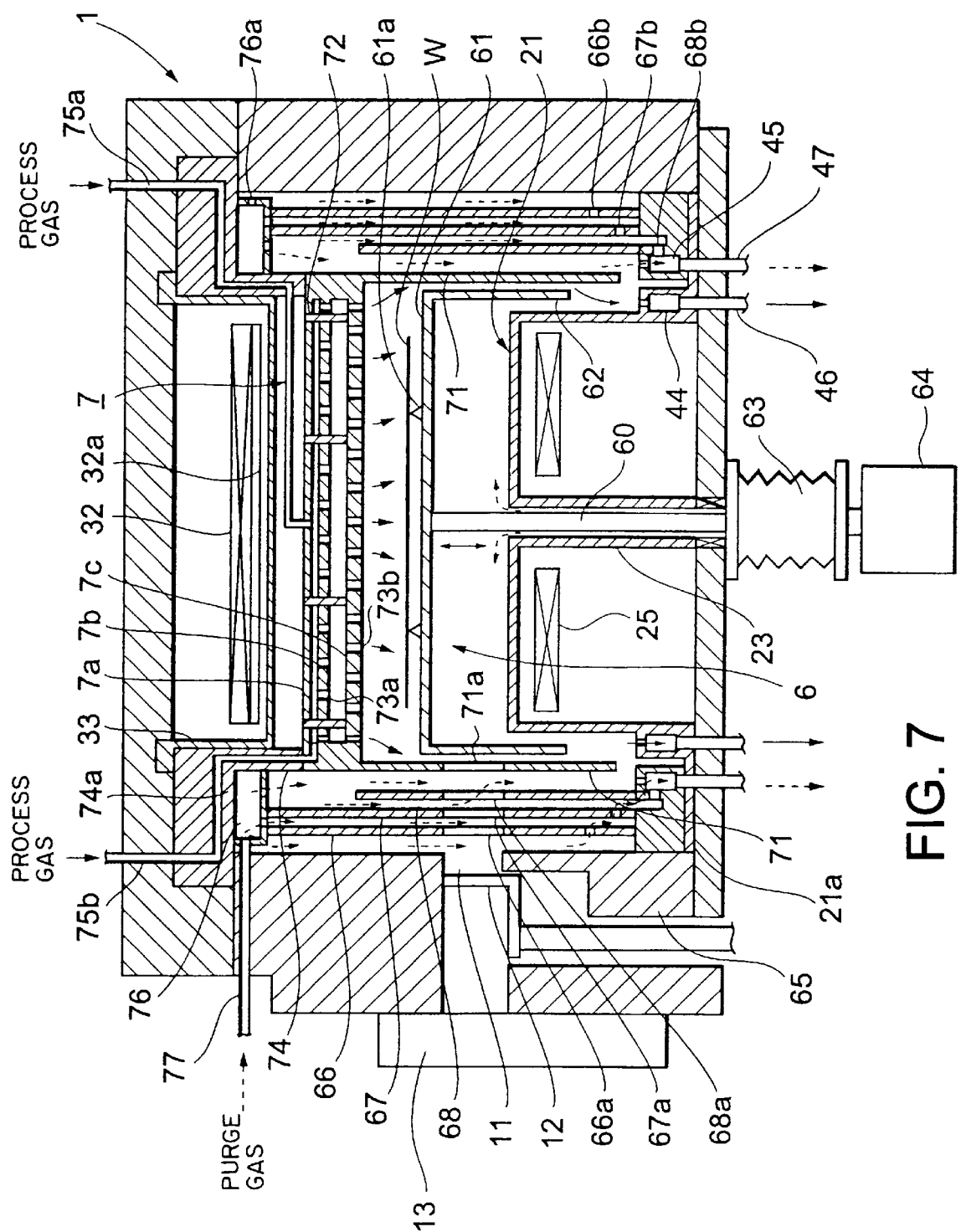
FIG. 7 is a vertical sectional view of a heat-treatment system in a second embodiment according to the present invention.

A heat-treatment system in a second embodiment according to the present invention as embodied in an oxidation system will be described with reference to FIG. 7, in which only matters different from those of the oxidation system in the first embodiment will be described. Referring to FIG. 7, the oxidation system is provided with a wafer support unit 6 comprising a vertically movable, rotating, lifting shaft 60, a wafer support table 61 made of quartz and attached in a horizontal attitude to the upper end of the lifting shaft 60, a skirt 62 extending substantially vertically downward from the circumference of the wafer support table 61 and having an inside diameter greater than the outside diameter of a central cylindrical protuberance 21, and a lifting mechanism 64 for vertically moving the lifting shaft 60. When the wafer support table 61 is held at a first position (lower position), which will be described later, the lower end of the skirt 62 lies on a level slightly above the level corresponding to the upper surface of a process gas exhaust duct 44 connected to the side wall of the central cylindrical protuberance 21. When the wafer support table 61 is held at a second position (upper position), which will be described later, the lower end of the skirt 62 lies on a level below the level corresponding to the upper surface of the central cylindrical protuberance 21. The wafer support table 61 is provided on its upper surface with projections 61a on which a wafer W rests in a substantially horizontal position. Temperature sensors for measuring the temperature of a wafer W supported on the projections 61a are embedded in the wafer support table 61.

The lifting shaft 60 is extended through a tubular projection 23 formed integrally with the central cylindrical protuberance 21. A lower end part of the lifting shaft 60 is extended through the bottom wall of a first vessel 1 and is connected to a bellows 63. The bellows 63 is connected to the lifting mechanism 64 and a rotating mechanism, not shown. A purge gas is supplied into the gap between the lifting shaft 60 and the tubular projection 23.

The wafer support table 61 is moved vertically between the first position where the wafer support table 61 is held when a wafer is carried into and carried out of the first vessel 1. and the second position where the wafer support table 61 is held while a wafer supported thereon is processed. Normally, the wafer support table 61 is held at the first position corresponding to an opening 11 formed in the first vessel 1 to carry a wafer into and carrying a wafer out of the first vessel 1. The lifting mechanism 64 raises the lifting shaft 60 to move the wafer support table 61 upward at a lifting speed in the range of 10 to 100 mm/s to the second position when a heat-treatment process is executed.

A process gas supply unit 7 is fixedly disposed between the wafer support table 61 and a heating device 32. As shown in FIG. 7, the process gas supply unit 7 is constructed by vertically arranging an upper disk 7a, a middle disk 7b and a lower disk 7c of the same diameter slightly greater than that of the upper surface of the central cylindrical protuberance 21 at predetermined intervals, and fitting the disks 7a, 7b and 7c in an upper part of a side wall 71 of quartz. The disks 7a, 7b and 7c are made of quartz. The process gas supply unit 7 is disposed with the disks 7a, 7b and 7c held in a horizontal position.

An upper space is formed between the disks 7a and 7b, and a lower space is formed between the disks 7b and 7c. The upper and the lower space are divided into three radial zones Z1, Z2 and Z3 by a partition member 72. Process gas supply holes 73a through which process gases are supplied into the annular zones Z1, Z2 and Z3 of the lower space are formed in the middle disk 7b. Process gas supply holes 73b through which process gases are supplied from the lower space into the first vessel 1 are formed in the lower disk 7c. The side wall 71 extends above the side wall of the process gas exhaust duct 44 connected to the side surface of the central cylindrical protuberance 21 and is provided with an opening 71a coinciding with the opening 11. The process gas supply unit 7 is suspended from the upper wall of the first vessel 1 by a support member 74 made of quartz and having a flange 74a. The flange 74a rests on the upper end of the side wall of the outer vessel 1. A cylindrical member 33 is fitted in the flange 74a of the support member 74. Temperature sensors, not shown, for measuring the temperature of process gases are embedded in the process gas supply unit 7. The heating device 32 controls the temperature of process gases on the basis of the temperature of the process gases measured by the temperature sensors.

Three passages 75a, 75b and 75c are formed in the support member 74 so as to be connected to the three zones Z1, Z2 and Z3 of the process gas supply unit 7, respectively. Only the passages 75a and 75b are shown in FIG. 7. The diameters of the process gas supply holes 73b are determined so that the flow rate of the process gases flowing through the gas supply holes 73b formed in a part of the third disk 7c nearer to the center of the third disk 7c is greater than that of the process gases flowing through the gas supply holes 73b formed in a part of the third disk 7c nearer to the circumference of the third disk 7c.

The central cylindrical protuberance 21 is provided at its lower end with a flange 21a seated on the inner surface of the bottom wall of the first vessel 1. A bottom ring 65 made of quartz is placed on the flange 21a so as to cover the inner surface of a lower end part of the side wall of the first vessel 1. A purge gas supply chamber 76 is formed under the flange 74a of the support member 74 suspending the process gas supply unit 7. A purge gas supply pipe 77 is connected to the purge gas supply chamber 76.

A first side wall 66 and a second side wall 67 are disposed at a predetermined radial interval so as to extend along and to cover the inner circumference of the side wall of the first vessel 1. The side walls 66 and 67 are made of quartz. The lower ends of the side walls 66 and 67 are connected to the upper surface of the bottom ring 65, and the upper ends of the same are connected to the lower surface of a wall defining the bottom of the purge gas supply chamber 76. The side walls 66 and 67 are provided respectively with openings 66a and 67a coinciding with the opening 11 of the first vessel 1.

Thus the central cylindrical protuberance 21, the bottom ring 65, the side walls 66 and 67, the wall defining the bottom of the purge gas supply chamber 76 and the process gas supply unit 7 form a second vessel made of quartz in the first vessel under the heating device 32. Therefore the inner surfaces of the first vessel 1 are covered with quartz members.

A cylindrical member 68 made of quartz is supported on the bottom ring 65 so as to extend between the inner side wall 67 and the side wall 71 of the process gas supply unit 7. The upper end of the cylindrical member 68 lies on a level above a level corresponding to the opening 11 and is provided with an opening 68a coinciding with the opening 11. The skirt 62 of the wafer support unit 6, the side wall 71 of the process gas supply unit 7 and the cylindrical member 68 form a flow control structure.

The walls defining the purge gas supply chamber 76 are provided with purge gas supply holes 76a opening into the space between the side wall of the first vessel 1 and the first side wall 66, the space between the first side wall 66 and the second side wall 67, and a space surrounded by the second side wall 67, respectively. A purge gas exhaust duct 45 is connected to the inner surface of the cylindrical member 68. Purge gas exhaust holes 66b, 67b and 68b are formed in lower parts of the first side wall 66, the second side wall 67 and the cylindrical member 68, respectively, to enable a purge gas to flow into the purge gas exhaust duct 45. All those components disposed inside the second vessel of quartz are made of quartz.

Figure 8A:
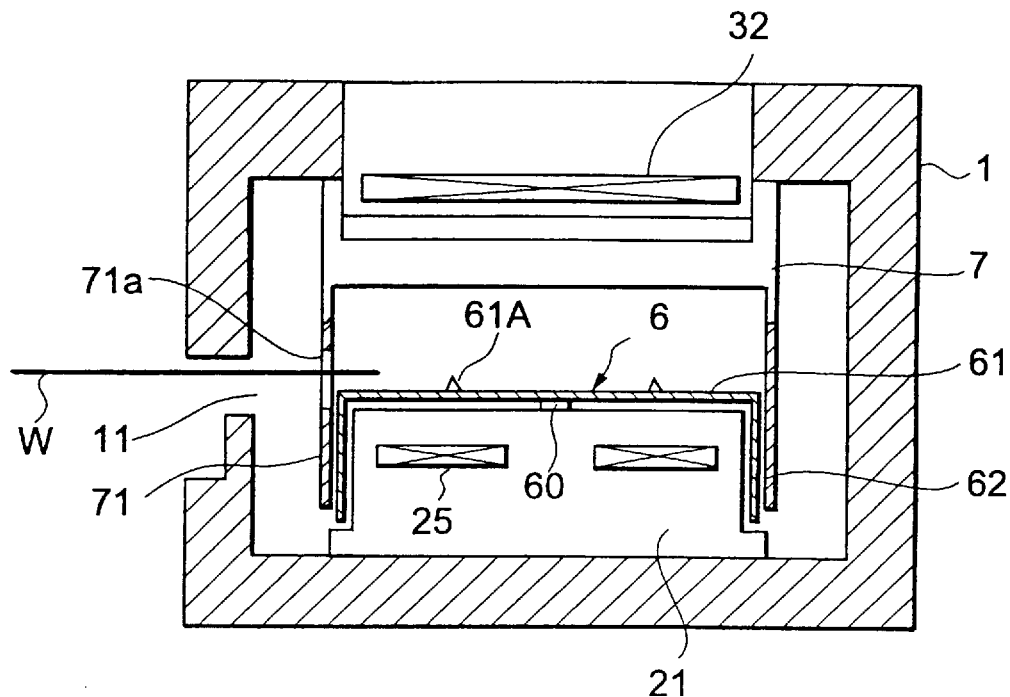
FIGS. 8A and 8B are sectional views for assistance in explaining operations of the heat-treatment system of FIG. 7.
Figure 8B:
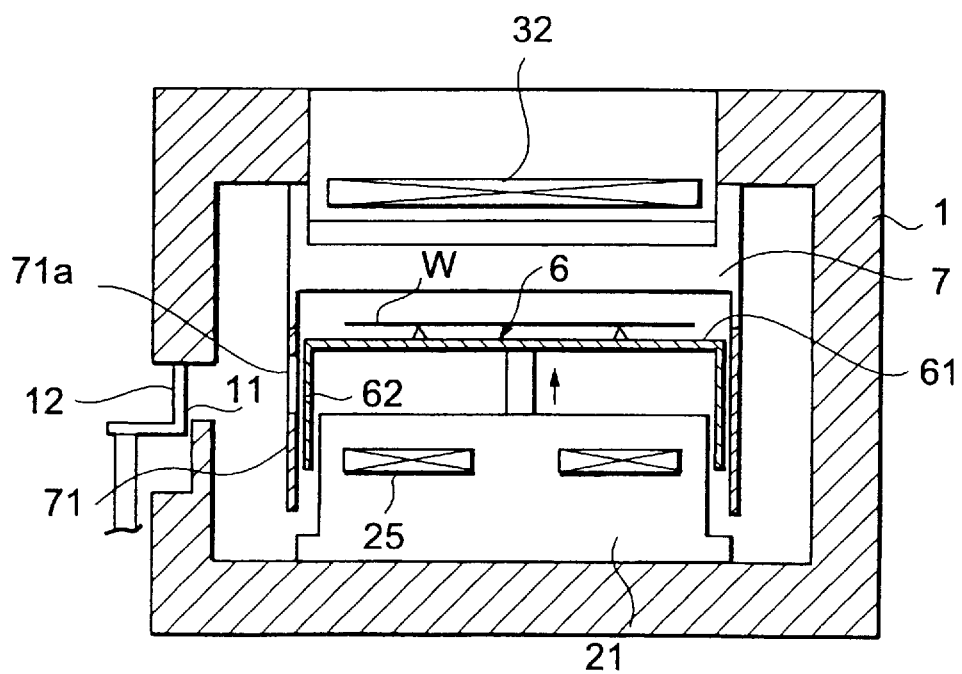

In operation, a shutter 12 is retracted to open the opening 11 and the wafer support table 6 is placed at the first position as shown in FIG. 8A. A wafer W is carried through the opening 11, the respective openings 66a, 67a, 68a and 71a of the first side wall 66, the second side wall 67, the cylindrical member 68 and the side wall 71 into the first vessel 1 and is placed on the projections 61a of the wafer support table 61. The temperature controller 25 and the heating device 32 are controlled so as to heat the wafer W supported on the wafer support table 61, for example, at a temperature on the order of 600° C. The opening 11 is closed by the shutter 12 and the wafer support table 61 is raised at a speed in the range of 10 to 100 mm/s to the second position as shown in FIG. 8B. Then, the temperature controller 25 and the heating device 32 are controlled so that the wafer W is heated at a processing temperature of, for example, 1000° C. Subsequently, processing gases, such as HCl gas and $O_2$ gas, and a purge gas, such as $N_2$ gas, are supplied, into the first vessel. During an oxidation process, the opening 71a of the side wall 71 is covered with the skirt 62, and the wafer W is enclosed by the process gas supply unit 7 and the wafer support table 61.

The process gases flow from the zones Z1, Z2 and Z3 of the process gas supply unit 7 through the process gas supply holes 73b toward the surface of the wafer W. The process gases flows radially outward along the surface of the wafer W and further through the space between the side wall 71 and the skirt 62 toward the process gas exhaust duct 44. The process gases are exhausted through the process gas exhaust duct 44 and an exhaust pipe 46. The purge gas flows from the purge gas chamber 76 through the space between the side wall of the first vessel 1 and the first side wall 66, the space between the first side wall 66 and the second side wall 67, and the space inside the second side wall 67 toward the purge gas exhaust duct 45. The purge gas is exhausted through the purge gas exhaust duct 45 and a purge gas exhaust pipe 47.

A purge gas flow region is formed outside the flow control structure consisting of the side wall 71, the first side wall 66, the second side wall 67 and the cylindrical member 68, and a process gas flow region is formed inside the flow control structure. Thus the purge gas flow region and the process gas flow region are separated from each other by the flow control structure forming labyrinths, which makes it difficult for the process gases to flow outside the flow control structure and suppresses the flow of the process gases outside the second vessel.

Even in a state where the wafer support table 61 is raised to the second position for the heat-treatment process, the skirt 62 of the wafer support table 61 covers an upper part of side wall of the central cylindrical protuberance 21. Consequently, it is difficult for the process gases to flow into the space between the central cylindrical protuberance 21 and the wafer support table 61. Since the purge gas is supplied through the gap between the tubular projection 23 and the lifting shaft 60 into the space between the central cylindrical protuberance 21 and the wafer support table 61, the flow of the process gases into the gap between the tubular projection 23 and the lifting shaft 60 can be suppressed to prevent the corrosion of the metal component members of the driving mechanism and the lifting mechanism interlocked with the lower end part of the lifting shaft 60.

Since the wafer support table 61 is raised to the second position to form a small processing space between the wafer support table 61 and the process gas supply unit 7, time necessary for replacing the atmosphere filling the processing chamber with the process gases can be reduced, so that the heat-treatment system is able to operate at an improved throughput. Since the wafer W is surrounded by the side wall 71 of the process gas supply unit 7 during the heat-treatment process, the environmental condition of the wafer W with respect to a circumferential direction is isotropic during the heat-treatment process and the surface of the wafer W can highly uniformly be subjected to the heat-treatment process.

Since the flow of the process gases outside the second vessel made of quartz can be suppressed, the possibility of contact of the process gases with the inner surfaces of the first vessel 1 is suppressed. Accordingly, the corrosion of the first vessel 1 can be suppressed even if a highly corrosive process gas is used.

The process gas supply unit 7 may be disposed in a bottom region in the first vessel 1, the wafer support table 61 may be disposed in an upper region in the first vessel 1, a wafer W may be held by the wafer support table 61 with the wafer support table 61 held at a first position, and the wafer support table 61 may be moved down to a second position for a heat-treatment process.

(Third Embodiment)

Figure 9:
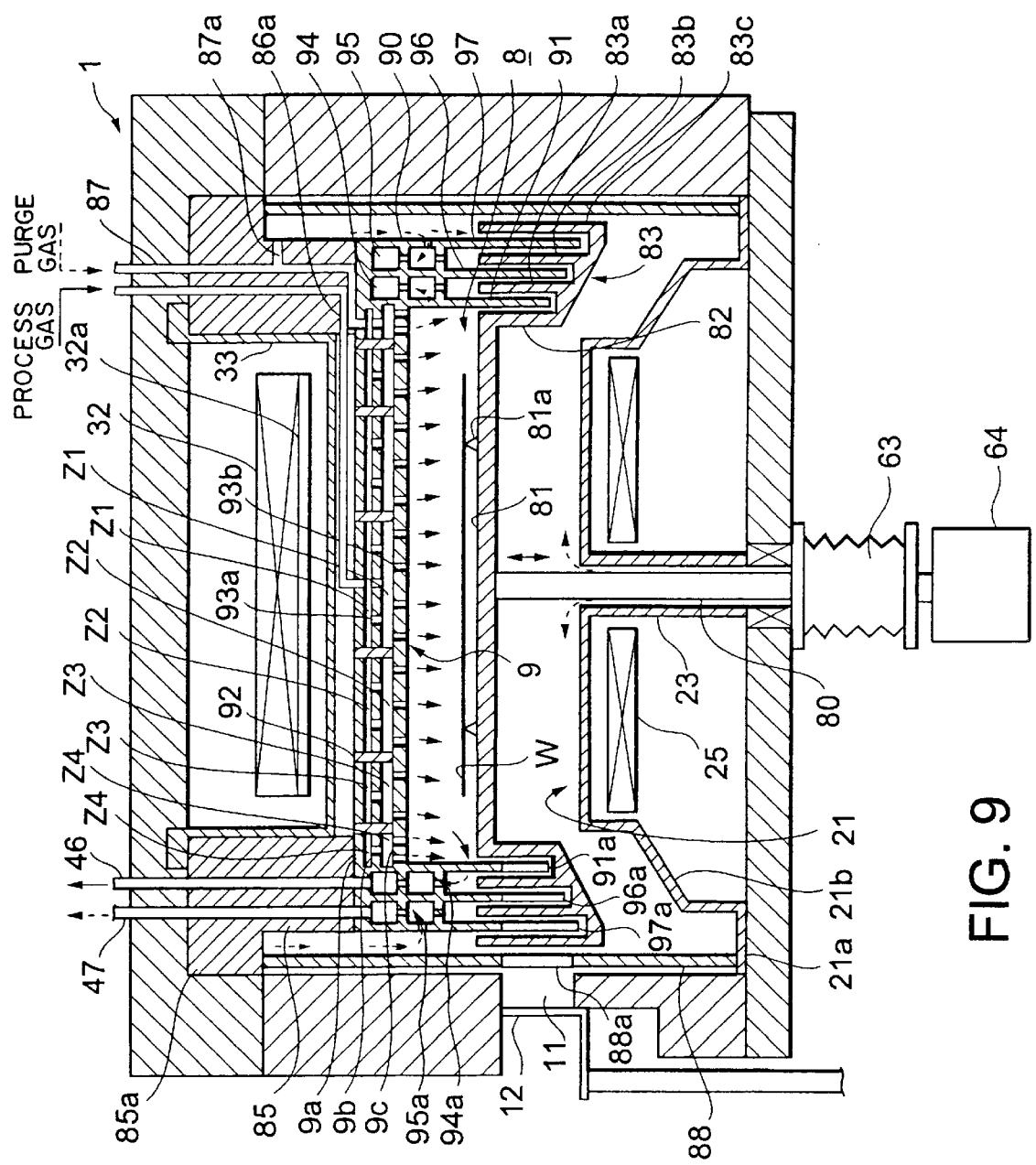
FIG. 9 is a vertical sectional view of a heat-treatment system in a third embodiment according to the present invention.

A heat-treatment system in a third embodiment according to the present invention as embodied in an oxidation system will be described with reference to FIG. 9. Referring to FIG. 9, the oxidation system is provided with a wafer support unit 8 comprising a vertically movable, rotating, lifting shaft 80, a wafer support table 81 made of quartz, attached in a horizontal position to the upper end of the lifting shaft 80 and having a diameter greater than the outside diameter of the upper wall of a central cylindrical protuberance 21, a skirt 82 extending substantially vertically downward from the circumference of the wafer support table 81, a sealing structure 83 connected to the lower end of the skirt 82, and a lifting mechanism 64 for vertically moving the lifting shaft 80. A lower end part of the lifting shaft 80 is extended through the bottom wall of a first vessel 1 and is connected to a bellows 63. The bellows 63 is connected to the lifting mechanism 64 and a rotating mechanism, not shown. A purge gas is supplied into the gap between the lifting shaft 80 and a tubular projection 23 projecting down ward from the upper wall of the central cylindrical protuberance 21.

The wafer support table 81 can be vertically moved between a first position (lower position) for carrying a wafer W into and carrying a wafer W from the first vessel 1 and a second position at which the wafer support table 81 is held during a heat-treatment process, such as an oxidation process. Normally, the wafer support table 81 is held at the first position corresponding to an opening 11 formed in the first vessel 1 and is raised to the second position near a process gas supply unit 9 during a heat-treatment process.

The skirt 82 extends substantially vertically downward from the circumference of the wafer support table 81. When the wafer support table 81 is held at the first position, the skirt 82 surrounds an upper part of the side wall of the central cylindrical protuberance 21. The sealing structure 83 has three substantially vertical, cylindrical walls 83a, 83b and 83c. The cylindrical walls 83a, 83b and 83c are arranged concentrically at predetermined radial intervals.

The lengths of the cylindrical walls 83a, 83b and 83c are determined so that the respective upper ends of the cylindrical walls 83a, 83b and 83c are below a region corresponding to the opening 11 of the first vessel 1 when the wafer support table is held at the first position, and the outer cylindrical wall 83c cover the opening 11 when the wafer support table 81 is held at the second position. In the third embodiment, the upper ends of the cylindrical walls 83a, 83b and 83c are included in a horizontal plane including the upper surface of the wafer support table 81. The sealing structure has an annular wall formed integrally with the cylindrical walls 83a, 83b and 83c and tapered upward, so that the outer cylindrical wall 83c has the greatest height, and the inner cylindrical wall 83a has the smallest height. The side wall of the central cylindrical protuberance 21 has an upward tapered part 21b corresponding to the annular wall of the sealing structure.

A gas supply/exhaust unit 9 made of quartz is disposed opposite to the wafer support table 81 between a heating device 32 and the wafer support unit 8. The gas supply/ exhaust unit 9 is constructed by vertically arranging an upper disk 9a, a middle disk 9b and a lower disk 9c of the same diameter slightly greater than that of the wafer support table 81 at predetermined intervals, and fitting the disks 9a, 9b and 9c in an upper part of a side wall 91 of quartz. The disks 9a, 9b and 9c are made of quartz. The process gas supply unit 9 is disposed with the disks 9a, 9b and 9c held in a horizontal position. An upper space is formed between the disks 9a and 9b, and a lower space is formed between the disks 9b and 9c. The upper and the lower space are divided into four radial zones Z1, Z2, Z3 and Z4 by a partition member 92. Process gas supply holes 93a through which process gases are supplied into the annular zones Z1, Z2 and Z3 of the lower space are formed in the middle disk 9b. Process gas supply holes 93b through which process gases are supplied from the lower space into the first vessel 1 are formed in the lower disk 9c. The process gas supply unit 9 is suspended from the upper wall of the first vessel 1 by a support member 85 made of quartz, having a flange 85a and surrounding a cylindrical member 33. The flange 85a of the support member 85 covers a part of the inner surface of the upper wall of the first vessel 1 around the cylindrical member 33.

Three process gas supply pipes 86a, 86b and 86c (only the process gas supply pipe 86a is shown) are extended in the support member 85 and are connected to the three zones Z1, Z2 and Z3 of the upper space of the gas supply/exhaust unit 9. The diameters of the process gas supply holes 93b are determined so that the flow rate of the process gases flowing through the gas supply holes 93b formed in a part of the third disk 9c nearer to the center of the third disk 9c is greater than that of the process gases flowing through the gas supply holes 93b formed in a part of the third disk 9c nearer to the circumference of the third disk 9c. A purge gas supply pipe 87 is extended in the support member 85 and is connected to the fourth zone Z4 of the gas supply/exhaust unit 9. Branch pipes 87a branching from the purge gas supply pipe 87 open into a space surrounding the support member 85 to supply a purge gas into the same space.

The side wall 91 is disposed at a position corresponding to the space between the skirt 82 of the wafer support unit 8 and the inner cylindrical wall 83a. An exhaust duct 90 provided with two radially arranged exhaust chambers 94 and 95 is formed outside the side wall 91. Each of the exhaust chambers 94 and 95 is divided into an upper section and a lower section. The inner exhaust chamber 94 is a process gas exhaust chamber, and the outer exhaust chamber 95 is a purge gas exhaust chamber. The lower section of the process gas exhaust chamber 94 is disposed in a space below a peripheral part of the third disk 9c and above a peripheral part of a wafer W supported on the wafer support table 81. The exhaust chambers 94 and 95 are provided with exhaust holes 94a and 9,5a and are connected to a process gas exhaust pipe 46 and a purge gas exhaust pipe 47, respectively.

Cylindrical walls 96 and 97 are extended substantially vertically downward from the lower wall of the exhaust duct 90 in spaces corresponding to an annular space between the cylindrical walls 83a and 83b and an annular space between the cylindrical walls 83b and 83c, respectively. The length and thickness of the side wall 91 and the cylindrical walls 96 and 97 are determined so that the side wall 91, and the cylindrical walls 96 and 97 are received in an annular space between the skirt 82 and the cylindrical wall 83a, an annular space between the cylindrical walls 83a and 83b, and an annular space between the cylindrical walls 83b and 83c, respectively, when the wafer support table 81 is held at the second position. The side wall 91, the cylindrical walls 96 and 97, and the cylindrical walls 83a, 83b and 83c overlap each other to form labyrinths. The side wall 91 and the cylindrical walls 96 and 97 are provided with openings 91a, 96a and 97a coinciding with the opening 11, respectively. When the wafer support table 81 is held at the second position, a wafer W supported on the wafer support table 81 is on a level above that of the opening 91a and is surrounded by the side wall 91.

The side wall of the first vessel 1 is lined with a side wall 88 made of quartz. The side wall 88 has one end connected to the upper surface of a flange 21a of the central cylindrical protuberance 21 and the other end connected to the lower surface of the support member 85. The side wall 88 is provided with an opening 88a coinciding with the opening 11 of the first vessel 1. Thus a quartz vessel consisting of the central cylindrical protuberance 21, the side wall 88, the support member 85 and the gas supply/exhaust unit 9 is disposed under the heating device 32 in the first vessel 1. The inner surfaces of the first vessel 1 are covered with the quartz members. All the members disposed in the quartz vessel are made of quartz.

Figure 10A:
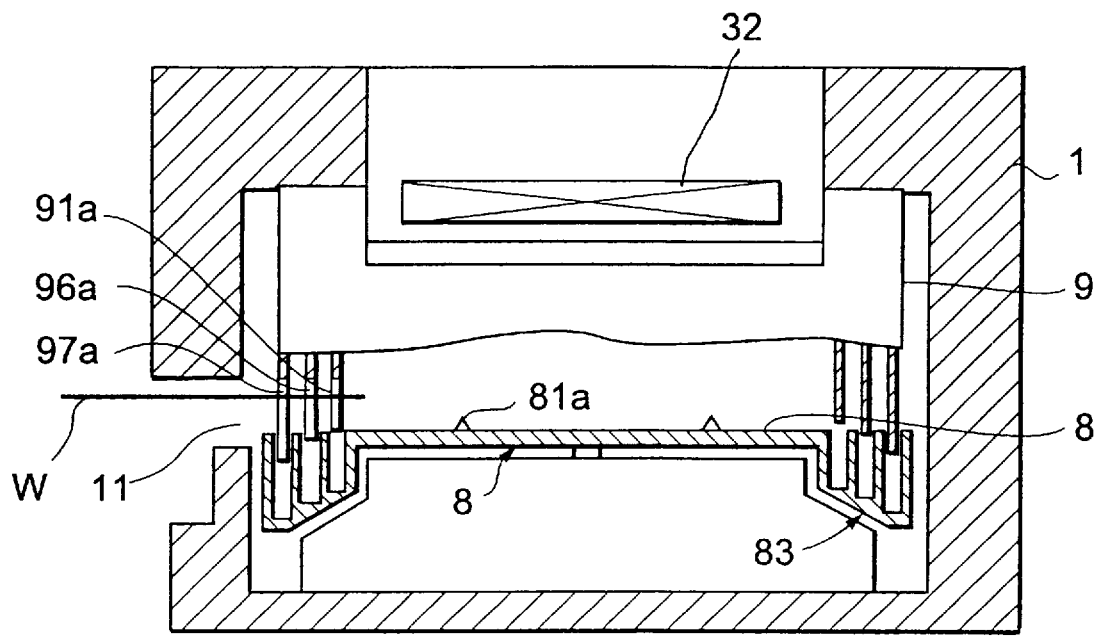
FIGS. 10A and 10B are sectional views of assistance in explaining operations of the heat-treatment system of FIG. 9.
Figure 10B:
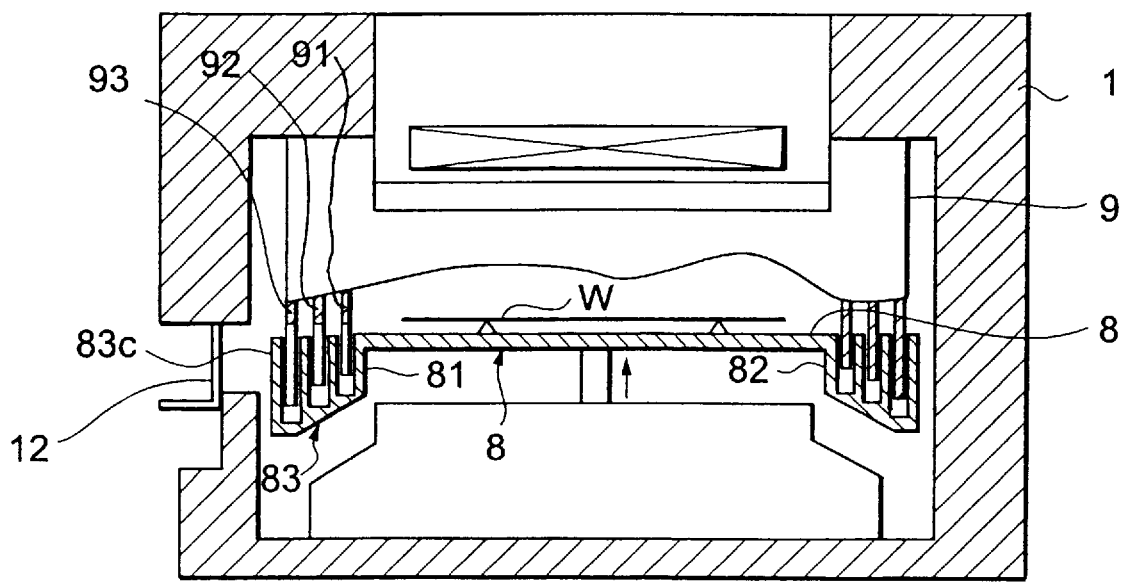

In operation, a shutter 12 is retracted to open the opening 11 with the wafer support table 81 placed at the first position as shown in FIG. 10A. A wafer W is carried through the opening 11 of the first vessel 1, and the respective openings 88a, 91a, 96a and 97a of the side wall 91 and the cylindrical walls 96 and 97 into the first vessel 1 and is placed on the projections 81a of the wafer support table 81. The temperature controller 25 and the heating device 32 are controlled so that the surface of the wafer W supported on the wafer support table 81 is heated, for example, at a temperature on the order of 600° C. The opening 11 is closed by the shutter 12 and the wafer support table 81 is raised at a speed in the range of 10 to 100 mm/s to the second position as shown in FIG. 10B. In this state, the side wall 91 and the cylindrical walls 96 and 97 of the gas supply/exhaust unit 9, and the cylindrical walls 83a, 83b and 83c overlap radially each other to form labyrinths.

Then, the temperature controller 25 and the heating device 32 are controlled so that the wafer W is heated at a processing temperature of, for example, 1000° C. Subsequently, processing gases, such as HCl gas and $O_2$ gas, and a purge gas, such as $N_2$ gas, are supplied into the first vessel. During an oxidation process, the openings 91a, 96a and 97a of the side wall 91 and the cylindrical walls 96 and 97 are covered with the skirt 82 of the wafer support table 81 and the sealing structure 83, and the wafer W is enclosed by the gas supply/exhaust unit 9 and the wafer support table 81.

The process gases flow from the zones Z1, Z2 and Z3 of the gas supply/exhaust unit 9 through the process gas supply holes 93b toward the surface of the wafer W. The process gases flows radially outward along the surface of the wafer W and further toward the process gas exhaust chamber 94. The process gases are exhausted through the exhaust chamber 94 and the exhaust pipe 46. Part of the process gases flows through the space between the side wall 91 and the skirt 82, and flows through the openings 91a into the exhaust chamber 94. The purge gas flows from the zone Z4 through the gas supply holes 93b toward the circumference of the wafer W. The purge gas also flows toward the outer circumference of the support member 85. The purge gas directed toward the circumference of the wafer W is exhausted through the exhaust chamber 94 and the exhaust pipe 47, flows through the space between the side wall 91 and the skirt 82, and flows through the openings 91a and 96a into the exhaust chambers 94 and 95. The purge gas supplied toward the outer circumference of the support member 85 flows down toward the exhaust chamber 95 and is exhausted through the exhaust pipe 47.

The process gases supplied into the first vessel 1 flow through the labyrinths formed by the radially overlapping side wall 91, the cylindrical walls 96 and 97, and the cylindrical walls 83a, 83b and 83c of the sealing structure 83, and are exhausted through a space extending over the periphery of the wafer W. Since a process gas flow region is surrounded by a purge gas flow region, it is difficult for the process gases to flow downward through the labyrinths. Consequently, it is difficult for the process gases to flow outside the second vessel made of quartz through the opening 91a of the side wall 91. Since it is difficult for the process gases to flow downward through the labyrinths even when the wafer support table 81 is raised to the second position for a heat-treatment process, the flow of the process gases into a space between the central cylindrical protuberance 21 and the wafer support table 81 is suppressed. Since the purge gas is supplied into the space between the central cylindrical protuberance 21 and the wafer support table 81, the corrosion of the metal parts of the lifting mechanism 64 and the driving mechanism can be prevented.

In the third embodiment, the wafer support table 81 is raised to the second position to form a small processing space between the wafer support table 81 and the gas supply/exhaust unit 9 for a heat-treatment process. Therefore, time necessary for replacing the atmosphere filling the processing chamber with the process gases can be reduced, so that the heat-treatment system is able to operate at an improved throughput. Since the wafer W is surrounded by the side wall 91 of the gas supply/exhaust unit 9 during the heat-treatment process, the radiation of heat from the wafer W with respect to a circumferential direction is isotropic during the heat-treatment process and the surface of the wafer W can highly uniformly be subjected to the heat-treatment process. The leakage of the process gases from the second vessel made of quartz is thus suppressed. Accordingly, the corrosion of the first vessel 1 can be suppressed even if a highly corrosive process gas is used.

Figure 11A:
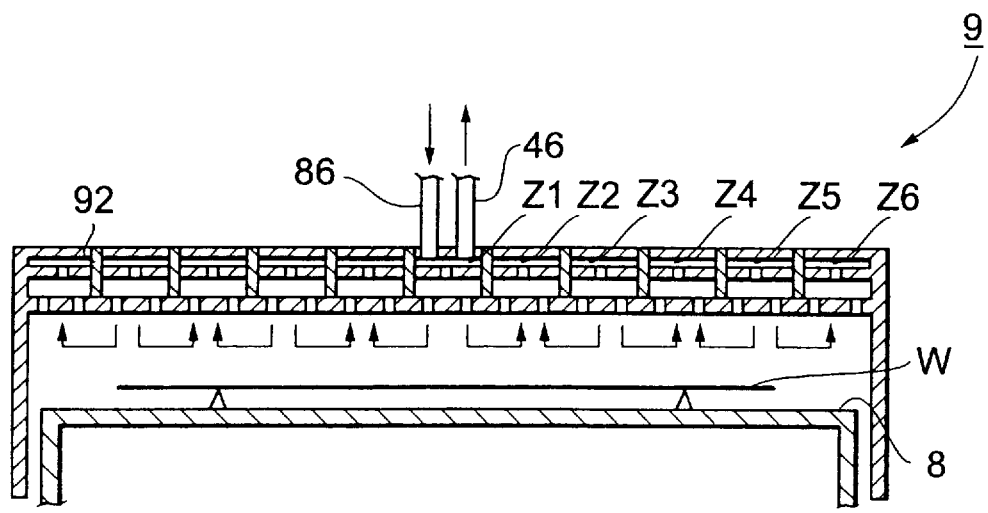
FIGS. 11A and 11B are vertical sectional views of a gas supply/exhaust unit included in the heat-treatment system of FIG. 9, of assistance in explaining the flow of process gases.
Figure 11B:
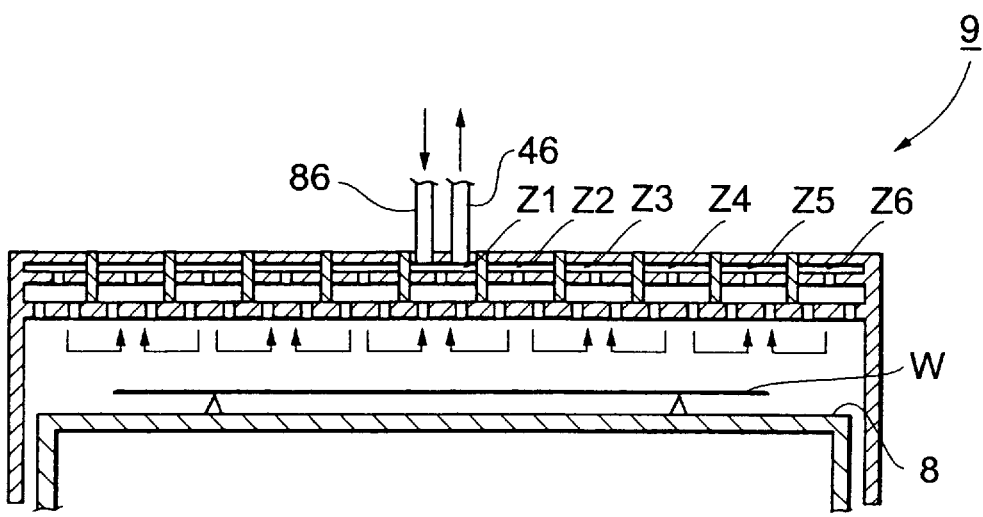

A gas supply/exhaust unit 9 as shown in FIG. 11A and 11B may be employed instead of the gas supply/exhaust unit 9 shown in FIG. 9. As shown in FIG. 11A the gas supply/exhaust unit 9 has six zones Z1 to Z6 in a concentric arrangement, and a process gas supply pipe 86 and a process gas exhaust pipe 46 are connected to each of the six zones Z1 to Z6. For example, the process gases are supplied through the process gas supply pipe 86 into the zones Z1, Z3 and Z5, and are exhausted through the zones Z2, Z4 and Z6 and the exhaust pipe 47. In FIG. 11A, arrows indicate flows of the process gases. FIG. 11B shows the gas supply/exhaust unit 9 used in a gas supply/exhaust mode different from that illustrated in FIG. 11B. The function of the zones Z1, Z3 and Z5 and that of the zones Z2, Z4 and Z6 are changed periodically during a heat-treatment process; that is, the zones Z1, Z3 and Z5 and the zones Z2, Z4 and Z6 are used alternately for supplying the process gases and for exhausting the process gases to change the flowing direction of the process gases periodically.

The gas supply/exhaust unit 9 may be disposed in a lower region of the first vessel 1, and the wafer support unit 8 may be disposed in an upper region of the first vessel 1 to put a wafer W on the wafer support table 8 at the first position and to place the wafer support table 81 at the second position for a heat-treatment process. The wafer support table 81 may be stationary and the gas supply/exhaust unit 9 may be vertically be moved relative to the wafer support table 81.

Figure 12:
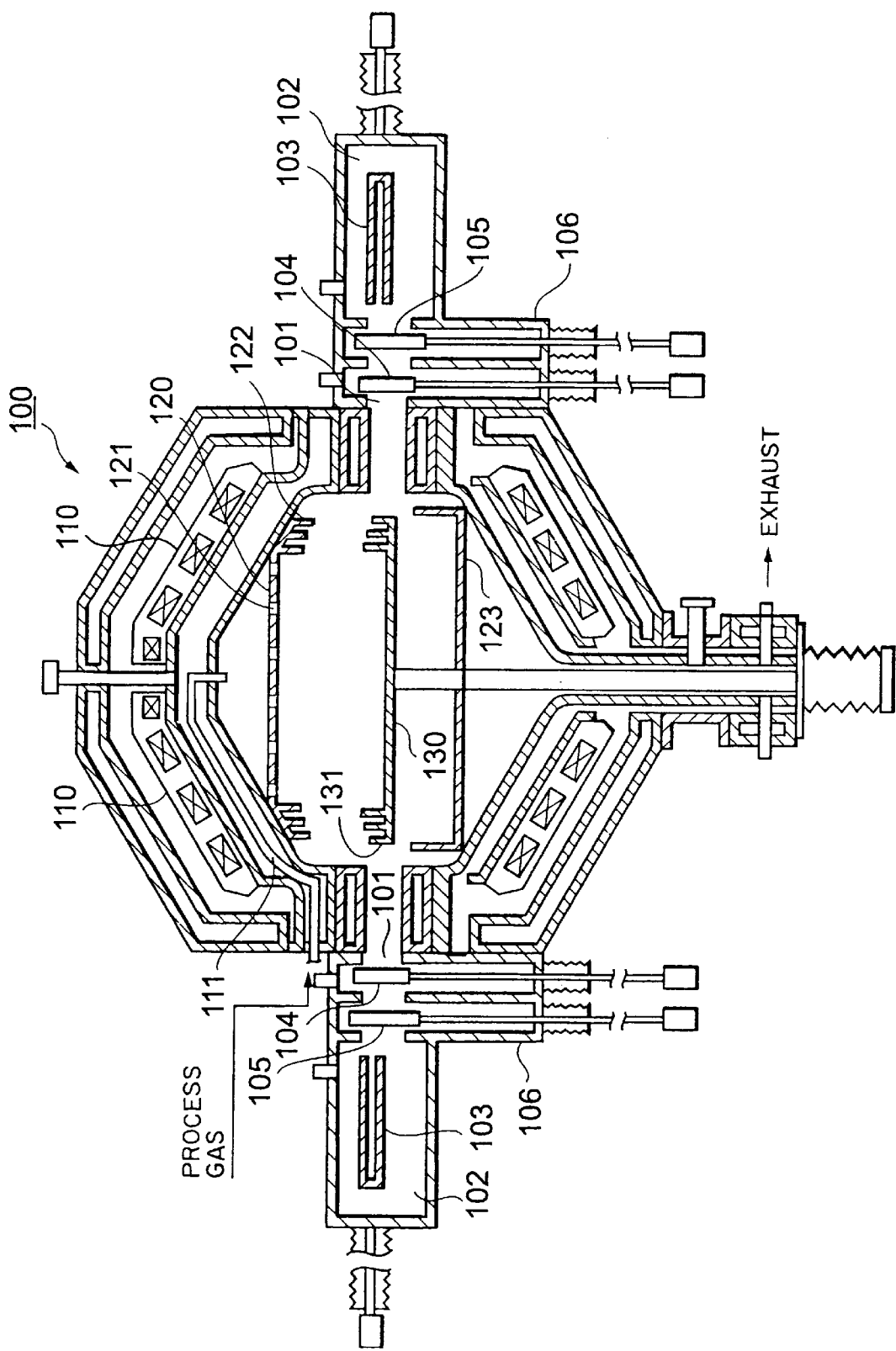
FIG. 12 is a vertical sectional view of a heat-treatment system in a fourth embodiment according to the present invention provided with a quartz vessel.

In the foregoing embodiments, the process gas supply unit (gas supply/exhaust unit) and the wafer support table define a small processing space. In an embodiment of the present invention, a process gas supply unit and a wafer support table may be disposed in a quartz vessel as shown in FIG. 12. Referring to FIG. 12, a quartz vessel 100 having a substantially hexagonal cross section is provided with openings 101 in opposite side walls thereof, respectively, and quartz transfer vessels 102 are joined to substantially central parts of the opposite side walls, respectively. The interiors of the quartz transfer vessels 102 communicate with the interior of the vessel 100 by means of the openings 101, respectively. A transfer arm 103 is disposed in each of the transfer vessels 102 to transfer a wafer W from the transfer vessel 102 to the vessel 100 and in reverse. A quarts shutter vessel 106 having two shutters 104 and 105 is interposed between each transfer vessel 102 and the side wall provided with the corresponding opening 101. A purge gas is supplied into the shutter vessels 106. A heating device 110 is disposed in an upper region of the interior of the vessel 100. A process gas supply pipe 111 is extended in a region under the heating device 110 to supply process gases into an upper central region in the vessel 100. The process gases are exhausted through a lower part of the vessel 100.

A gas diffusing plate 120 provided with gas supply holes 121 is disposed in an upper region of the interior of the vessel 100. A plurality of cylindrical walls, for example, three cylindrical walls 122, are extended downward from a peripheral part of the gas diffusing plate 120 so that a wafer W may not be interfered with by the cylindrical walls 122 when transferring the wafer W through the opening 101 between the outside and the inside of the vessel 100. A gas intercepting plate 123 is disposed in a lower region of the interior of the vessel 100. The gas intercepting plate 123 has a circumferential wall vertically extending upward so that the same may not interfere with the wafer W when transferring the wafer W through the opening 101 between the outside and the inside of the vessel 100. A wafer support table 130 is supported for vertical movement in the vessel 100. Vertical cylindrical walls 131 are formed in a peripheral part of the wafer support table 130 so as to overlap the cylindrical walls 122 of the gas diffusing plate 120 when the wafer support table 130 is raised to a processing position. The cylindrical walls 131 are provided with openings, not shown. All the components disposed in the vessel 100, the transfer vessels 102 and the shutter vessels 106 are made of quartz.

A wafer W is fed through the opening 101 into the quartz vessel 100, the wafer W is mounted on the wafer support table 130, the wafer support table 130 supporting the wafer W is raised to the processing position where the cylindrical walls 122 of the gas diffusing plate 120 and the cylindrical walls 131 of the wafer support table 130 overlap radially each other, and a heat-treatment process is carried out. Since all the components disposed in the vessel 100, the transfer vessels 102 and the shutter vessels 106 are made of quartz, the components will not be corroded even if process gases leak through the shutter vessels 106 into the transfer vessels 102. Since the wafer W is placed in a small processing space defined by the gas diffusing plate 120 and the wafer support table 130 during the heat-treatment process, the heat-treatment system is able to carry out the heat-treatment process at a high throughput and to heat-process the wafer W uniformly. The quartz vessel 100 may be employed in the heat-treatment systems shown in FIGS. 1, 7 and 9.

Figure 13A:
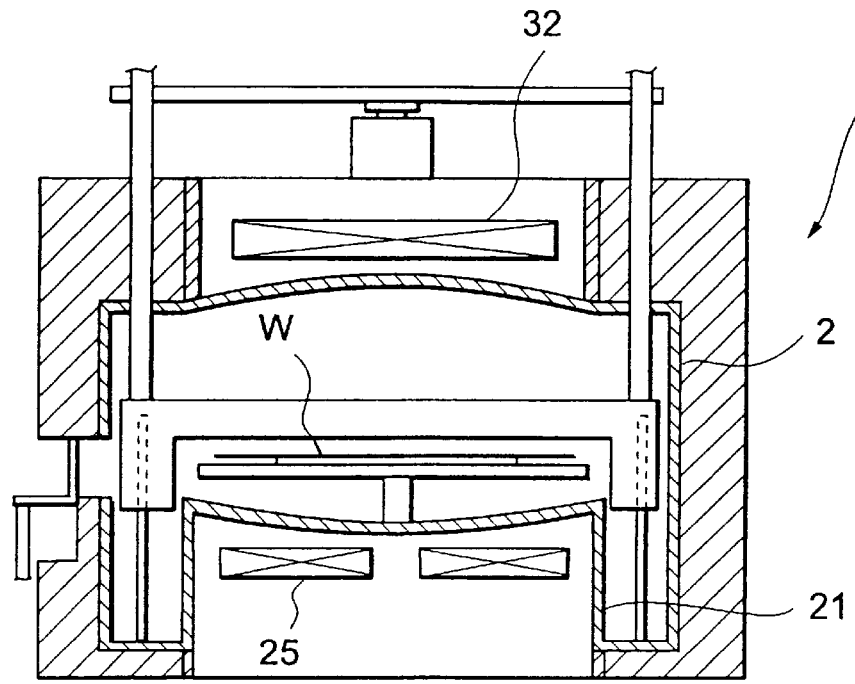
FIGS. 13A and 13B are vertical sectional views of quartz vessels in modifications.
Figure 13B:
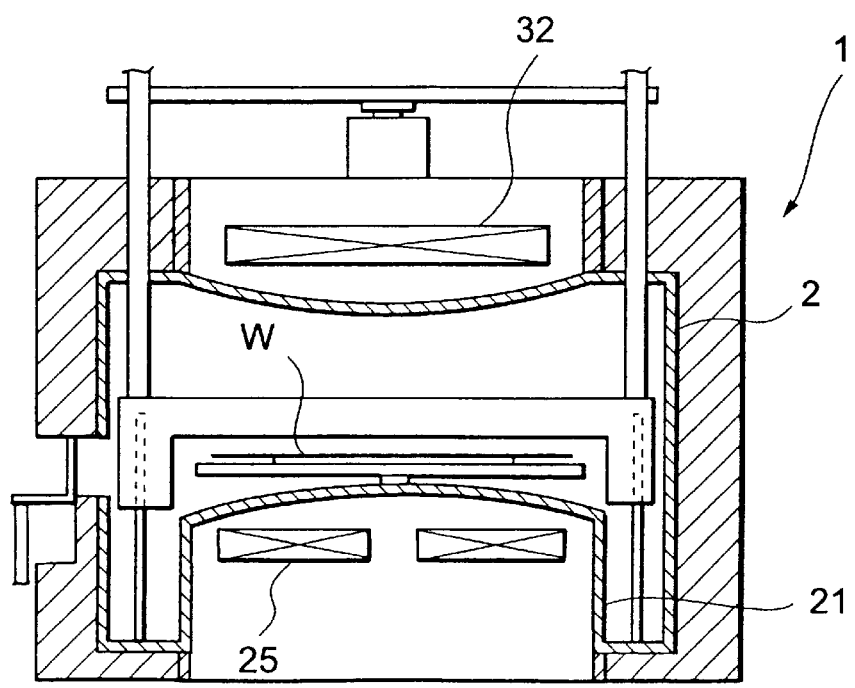
Figure 16:
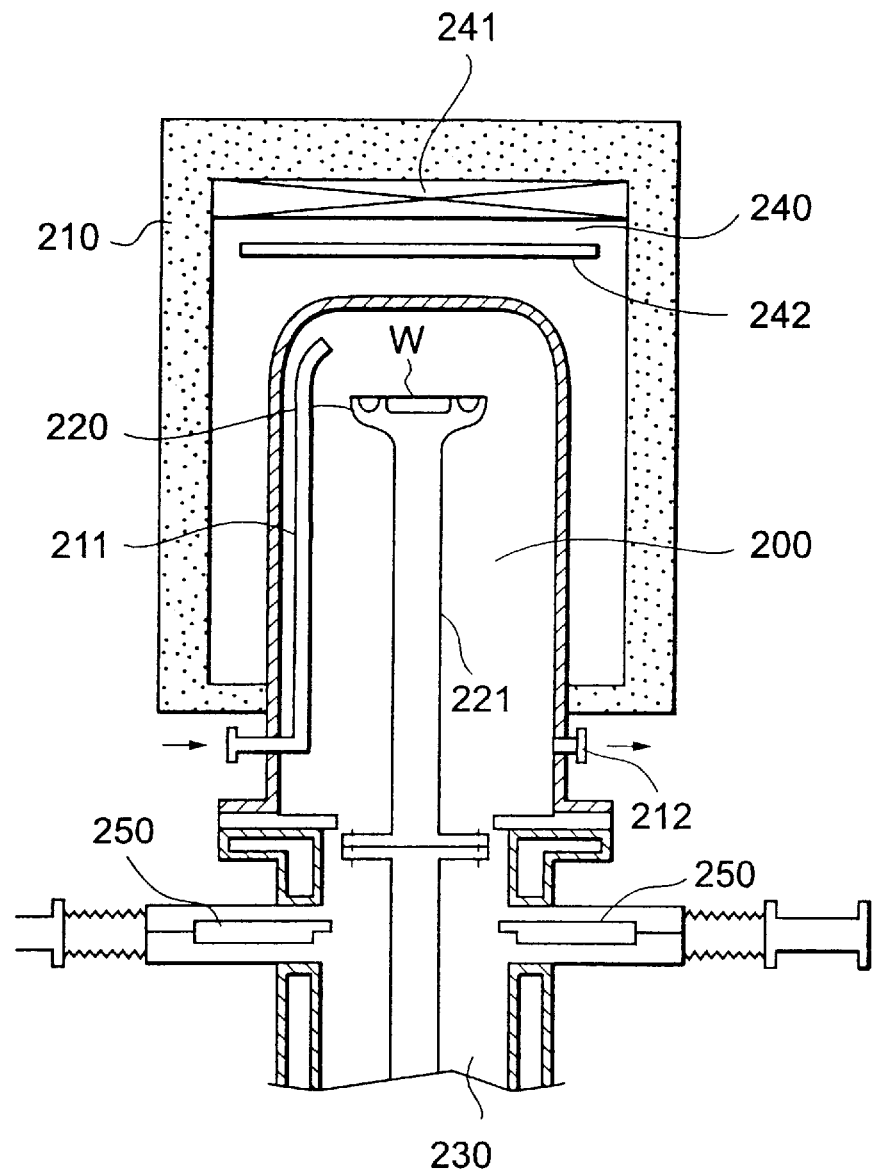
FIG. 16 is a vertical sectional view of a known single wafer processing heat-treatment system.
Figure 17:
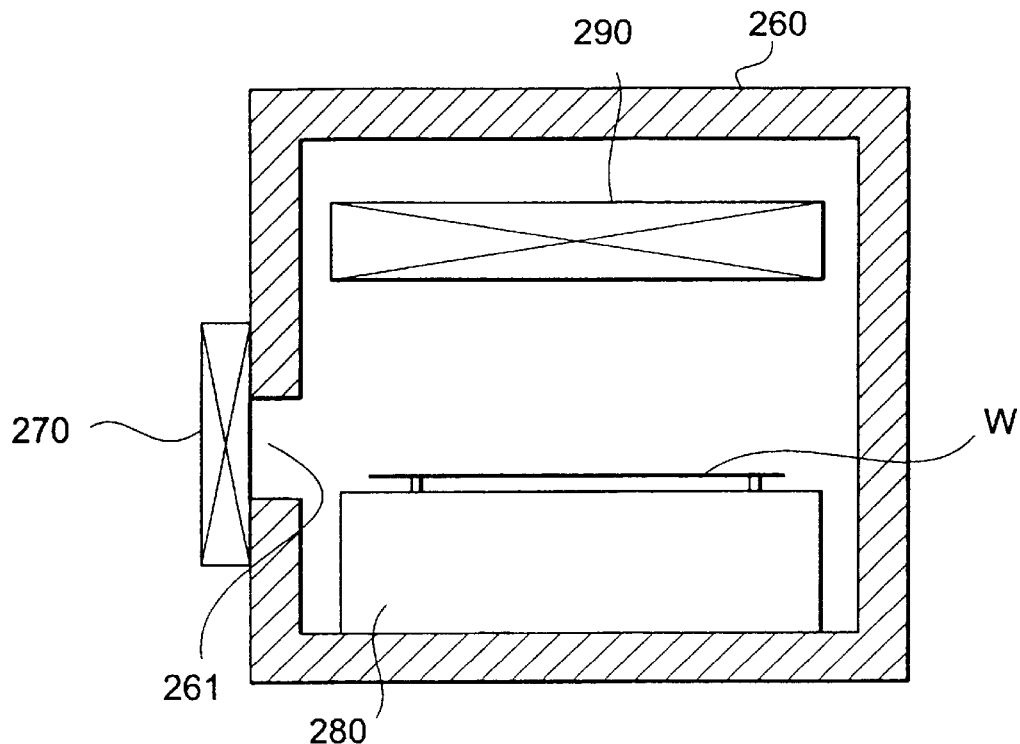
FIG. 17 is a sectional view of a known single wafer processing CVD system.
Figure 18:
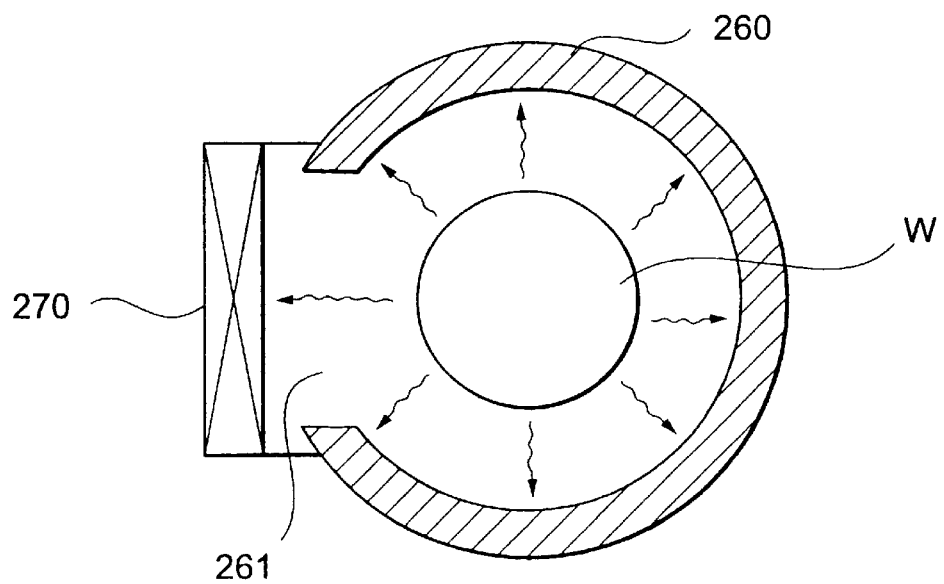
FIG. 18 is a schematic sectional view of assistance in explaining a mode of heat radiation in which a wafer radiates heat when the wafer is heat-treated by a known CVD system.

The second vessel 2 fitted in the first vessel 1, and the central cylindrical protuberance 21 may be those shown in FIG. 13A or 13B. FIG. 13A shows a structure including a second vessel 2 and a central cylindrical protuberance 21 and suitable for use in a heat-treatment system in which a first vessel 1 is evacuated to a vacuum, for example, on the order of $1 \times 10^3$ Torr. In the structure shown in FIG. 13A, a part of the upper wall of the second vessel 2 extending under the heating device 32, and the upper wall of the central cylindrical protuberance 21 are convex away from the wafer support table. Such shapes of the part of the upper wall of the second vessel 2 and the upper wall of the central cylindrical protuberance 21 enhances the strength of the structure under a vacuum. FIG. 13B shows a structure including a second vessel 2 and a central cylindrical protuberance 21 and suitable for use in a heat-treatment system in which a first vessel 1 is pressurized at a positive pressure which is more than several Torr higher than the atmospheric pressure. In the structure shown in FIG. 13B, a part of the upper wall of the second vessel 2 extending under the heating device 32, and the upper wall of the central cylindrical protuberance 21 are concave toward the wafer support table. Such shapes of the part of the upper wall of the second vessel 2 and the upper wall of the central cylindrical protuberance 21 enhances the strength of the structure under a pressure.

A preferable method of carrying a wafer W into the first vessel 1 of the heat-treatment system of the present invention will be described with reference to FIGS. 14A and 14B. Referring to these figures, a transfer arm 140 carries a wafer W into the first vessel 1 of the heat-treatment system shown in FIG. 1, 7 or 9, and places the wafer W on the wafer support table 24. A rotary table 141 is supported on the transfer arm 140. The wafer W is supported on the rotary table 141. The transfer arm 140 supporting the rotary table 141 advances through a space between the projections 24a and transfers the wafer W from the rotary table 141 onto the projections 24a. After the front half of the wafer W has passed the opening 11, the rotary table 141 supporting the wafer W turns through an angle of 180°, as shown in FIG. 14C. Then the wafer W is carried to a predetermined position opposite the wafer support table 24 and is transferred onto the projections 24a. If the diameter of the wafer W is as great as 30 cm, a part of the wafer W entered the first vessel 1 earlier is heated longer than a part of the wafer W entered the first vessel 1 later because the wafer W is carried at a relatively low carrying speed; consequently, the respective temperatures of the part entered the first vessel earlier and the part of the same entered the first vessel 1 later differ greatly. If the wafer W is turned through an angle of 180° after a front half thereof has entered the first vessel 1, the heated front half is exposed outside the first vessel 1 and is cooled while the rear half of the wafer W is heated, so that the wafer W is heated uniformly for uniform heat-treatment.

FIGS. 15A to 15D illustrates another effective method of carrying a wafer into the first vessel 1. This method covers a wafer W with a heat shielding member 150 to shield the wafer W from heat radiated by the heating device 32 when carrying the wafer W into the first vessel 1. The heat shielding member 150 may be formed in a shape having a U-shaped cross section so as to cover the transfer arm 140 supporting the wafer W. The heat shielding member 150 is inserted into the first vessel 1 through an opening 151 formed in a side wall opposite the side wall in which the opening 11 is formed, and is moved together with the transfer arm 140 supporting the wafer W in the first vessel 1.

When carrying a wafer W into the first vessel 1, the heat shielding member 150 is advanced near to and held near the opening 11 as shown in FIG. 15A. The transfer arm 140 supporting the wafer W is inserted in the heat shielding member 150 as shown in FIG. 15B. Subsequently, as shown in FIG. 15C, the wafer W shielded from heat radiated by, the heating device 32 by the heat shielding member 150 is moved to a transfer position directly above the wafer support table 24. Then, the heat shielding member 150 is retracted outside the first vessel 1 through the opening 151 as shown in FIG. 15D and the wafer W is transferred from the transfer arm 140 to the wafer support table 24. Since the wafer W is shielded from heat radiated by the heating device 32 by the heat shielding member 150 while the same is being carried in the first vessel 1, the wafer W is heated scarcely before the same is carried to the transfer position. Accordingly, the temperature difference between a part of the wafer W entered the first vessel 1 earlier and a part of the same entered the first vessel 1 later is small, whereby the uniformity of the effect of heat-treatment on the wafer is improved. The heat shielding member 150 may be capable of covering only the surface of the wafer W facing the heating device 32.

When heating the wafer W placed on the wafer support table at the processing temperature, the cooling plates 27a of the temperature controller 25 may be kept in the horizontal position as shown in FIG. 5A, the surface of the wafer W may be heated at a temperature on the order of 600° C. by the temperature controller 25 and may be heated to the processing temperature only by the heating device 32.

The heating device 32 may be held in an off state and the surface of the wafer W may be heated at a temperature on the order of 600° C. by the temperature controller 25 when the wafer W is carried into the first vessel, and then the heating device 32 may be turned on to heat the surface of the wafer W at the processing temperature. In this case, the temperature controller 25 need not be provided with the cooling unit 27. It is also possible that the temperature controller 25 is not provided with the heating unit 26 and controls the surface temperature of the wafer W at a temperature not higher than 500° C. by the cooling unit 27. Thus the temperature controller 25 serves as a preheating means for heating the wafer W at a surface temperature in the range of 500° to 700° C. for preparatory heating, and a means for keeping the surface of the wafer W at the processing temperature. When the process gas supply unit 7 or the gas supply/exhaust unit 9 is disposed in a lower region of the interior of the first vessel, the heating device 32 is disposed in a lower region of the interior of the first vessel.

The component members made of quartz and employed in the embodiments of the present invention may be replaced by those made of a highly heat-resistant nonmetallic material, such as silicon carbide. The present invention is applicable also to systems for heat-treatment processes and gas-treatment processes using corrosive gases as well as to the foregoing oxidation process. The purge gas may be argon gas or helium gas.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A substrate treatment system comprising:
    a vessel defining a processing chamber and having a side wall formed with an opening through which a wafer to be treated is carried into and the treated wafer is carried out of the vessel;
    a wafer support device disposed in the processing chamber defined by the vessel and having a wafer support table for holding a wafer thereon in a substantially horizontal attitude;
    a heating device for heating a wafer supported on the wafer support table of the wafer support device;
    a process gas supply unit disposed opposite to a surface to be treated of the wafer supported on the wafer support table of the wafer support device, for vertical movement and for supplying process gases toward the wafer; and
    an enclosing side wall extending from a circumference of the process gas supply unit so as to surround a processing space between the process gas supply unit and the wafer support device;
    said process gas supply unit being movable between a first level where the enclosing side wall does not cover the openings for enabling the wafer to be carried into and carried out of the processing chamber, and a second level where the enclosure covers the openings and surrounds the wafer for enabling the wafer to be subjected to a treatment process.

2. A substrate treatment system comprising:
    a first vessel made of a metal, defining a processing chamber and having a side wall formed with an opening through which a wafer to be treated is carried into and the treated wafer is carried out of the first vessel;

a second vessel made of a heat-resistant nonmetallic material, disposed in the processing chamber and having a side wall formed with an opening coinciding with the opening of the first vessel;

a wafer support device disposed in the processing chamber defined by the first vessel and having a wafer support table for supporting a wafer thereon in a substantially horizontal attitude;

a heating device for heating a wafer supported on the wafer support table of the wafer support device;

a process gas supply unit disposed opposite to a surface to be treated of a wafer supported on the wafer support table of the wafer support device, for vertical movement and for supplying process gases including a corrosive gas toward the wafer;

an enclosing side wall extended from a periphery of the process gas supply unit so as to surround a processing space between the process gas supply unit and the wafer support table of the wafer support device;

a purge gas supply system for supplying a purge gas into at least one of a space between the first vessel and the second vessel and a space between the second vessel and the enclosing side wall to prevent the process gases coming into contact with the first vessel made of a metal; and a gas exhaust duct provided in said second vessel;

said process gas supply unit being movable between a first level where the enclosing side wall does not cover the openings to enable the wafer to be carried into and carried out of the processing chamber, and a second level where the enclosing side wall covers the openings and surrounds the wafer to enable the wafer to be subjected to a treatment process.

3. The substrate treatment system according to claim 2, wherein a flow control member is disposed between an inner surface of the first vessel and the wafer support table of the wafer support device so as to surround the wafer support table of the wafer support device so that the flow control member and the enclosing side wall overlap each other with respect to a radial direction when the process gas supply unit is at the second level for supplying process gases to form purge gas flow regions in a space defined by the overlapping parts of the flow control member and the enclosure and a space outside the flow control member and to form a process gas flow region inside the overlapping parts of the flow control member and the encloing side wall.

4. The substrate treatment system according to claim 2, wherein the overlapping parts of the enclosing side wall and the flow control member form labyrinths.

5. The substrate treatment system according to claim 2, wherein a process gas exhaust duct is formed in a region of the interior of the first vessel, and a purge gas exhaust duct is formed on an outer side of the process gas exhaust duct in the region of the interior of the first vessel.

6. The substrate treatment system according to claim 1, wherein a lifting shaft for vertically moving the process gas supply unit is provided and a process gas supply passage is formed in the lifting shaft so as to be connected to the process gas supply unit.

7. The substrate treatment system according to claim 2, wherein a lifting shaft for vertically moving the process gas supply unit is provided and a process gas supply passage and a purge gas supply passage are formed separately in the lifting shaft.

8. The substrate treatment system according to claim 2, wherein the process gases include water vapor, and there is provided a temperature regulating means for regulating an inner surface of the vessel made of a metal at a temperature not lower than the dew point of the water vapor.

9. The substrate treatment system according to claim 2, wherein the heat-resistant nonmetallic material is one of quartz and silicon carbide.

10. The substrate treatment system according to claim 2, wherein the heating device is disposed either above or below a support surface of the wafer support table of the wafer support device, and a wafer temperature regulating device is provided opposite to the heating device with respect to the support surface of the wafer support table.

11. A substreate treatment system comprising:

a first vessel made of a metal, defining a processing chamber and having a side wall formed with an opening through which a wafer to be treated is carried into and the treated wafer is carried out of the first vessel;

a second vessel made of a heat-resistant nonmetallic material, disposed in the processing chamber and provided with an opening coinciding with the opening of the first vessel in said side wall;

a wafer support device disposed for vertical movement in the processing chamber defined by the first vessel, and having a wafer support table for supporting a wafer thereon in a substantially horizontal attitude;

a heating device for heating a wafer supported on the wafer support table of the wafer support device;

a process gas supply unit disposed opposite to a surface to be treated of a wafer supported on the wafer support table of the wafer support device, and capable of supplying process gases including a corrosive gas toward the wafer; and a purge gas supply system for supplying a purge gas into a space between the first vessel and the second vessel to prevent the process gases from coming into contact with the first vessel made of a metal; and a gas exhaust duct provided in said second vessel;

wherein the wafer support table of the wafer support device is movable between a first position on the same level as that of the opening or at a position away from the process gas supply unit with respect to the level of the opening, to enable the wafer to be carried into and carried out of the second vessel, and a second position nearer to the process gas supply unit with respect to the opening to enable the wafer to be subjected to a treatment process.

12. The substrate treatment system according to claim 11, wherein a flow control member is disposed between an inner surface of the second vessel and the wafer support device so as to surround the wafer support table of the wafer support device to form a purge gas flow region outside the flow control member and a process gas flow region inside the flow control member.

13. The substrate treatment system according to claim 11, wherein said gas exhaust duct includes a process gas exhaust duct formed in a region of the interior of the first vessel, and a purge gas exhaust duct formed on an outer side of the process gas exhaust duct in the region of the interior of the first vessel.

14. The substrate treatment system according to claim 11, wherein the process gases include water vapor, and there is provided a temperature regulating means for regulating an inner surface of the vessel made of a metal at a temperature not lower than the dew point of the water vapor.

15. The substrate treatment system according to claim 11, wherein the heat-resistant nonmetallic material is one of quartz and silicon carbide.

16. The substrate treatment system according to claim 11, wherein the heating device is disposed either above or below a support surface of the wafer support table of the wafer support device, and a wafer temperature regulating device is provided opposite to the heating device with respect to the support surface of the wafer support table.

17. A substrate treatment system comprising:

a vessel defining a processing chamber and having a side wall formed with an opening through which a wafer to be heat-treated is carried into and the treated wafer is carried out of the vessel;

a wafer support device disposed in the processing chamber defined by the vessel, and having a wafer support table for supporting a wafer thereon in a substantially horizontal attitude;

a heating device for heating a wafer supported on the wafer support table of the wafer support device; and a gas supply/exhaust unit having process gas supply holes facing a surface to be treated of a wafer supported on the wafer support table of the wafer support device and gas exhaust holes formed in a peripheral part thereof, said gas supply/exhaust unit being capable of being vertically moved relative to the wafer support device;

wherein said wafer support device and said gas supply/exhaust unit having:

a first relative position wherein the wafer support table of the wafer support device is separated from the gas supply/exhaust unit so that the respective circumferential parts of the wafer support table and the gas supply/exhaust unit are separated from each other to enable the wafer to be carried into and carried out of the processing chamber, and a second relative position wherein the wafer support table is disposed close to the gas supply/exhaust unit so that the respective circumferential parts of the wafer support table and the gas supply/exhaust unit overlap each other with respect to the radial direction fo the processing chamber so as to form labyrinths, to enable procss gases supplied through the gas supply holes to flow through the labyrinths and be exhausted through the exhaust holes.

18. The substrate treatment system according to claim 17, wherein the vessel defining the processing chamber is made of a metal, and component members of the wafer support device and the gas supply/exhaust unit are made of a heat-resistant nonmetallic material, the process gases include a corrosive gas, and a purge gas supply system is provided to supply a purge gas into a space between the vessel and the gas supply/exhaust unit and a space between the vessel and the wafer support table to avoid exposing the vessel made of a metal to the corrosive gas.

19. The substrate treatment system according to claim 17, wherein the process gases include water vapor, and there is provided a temperature regulating means for regulating an inner surface of the vessel made of a metal at a temperature not lower than the dew point of the water vapor.

20. The substrate treatment system according to claim 17, wherein the heat-resistant nonmetallic material is one of quartz and silicon carbide.

21. The substrate treatment system according to claim 17, wherein the heating device is disposed either above or below a support surface of the wafer support table of the wafer support device, and a wafer temperature regulating device is provided opposite to the heating device with respect to the support surface of the wafer support table.

22. A substrate treatment system comprising:

a vessel defining a processing chamber and having a side wall formed with an opening through which a wafer is carried into and carried out of the processing chamber;

a wafer support device disposed in the processing chamber, and having a wafer support table for supporting a wafer thereon in a substantially horizontal attitude;

a heating device for heating a wafer supported on the wafer support table of the wafer support device;

a process gas supply unit for supplying process gases toward a wafer supported on the wafer support table;

a carrying means for carrying a wafer into the processing chamber and transferring the wafer to the wafer support table of the wafer support device; and a wafer turning means for turning a wafer through an angle of 180° in a period between a time point when at least a part of the wafer is inserted in the processing chamber and a time point when the same part of the wafer reaches a position corresponding to the wafer support table of the wafer support device.

23. A substrate treatment system comprising:

a vessel defining a processing chamber and having a side wall formed with an opening through which a wafer to be treated is carried into the processing chamber and the treated wafer is carried out of the processing chamber;

a wafer support device disposed in the processing chamber, and having a wafer support table for supporting a wafer thereon in a substantially horizontal attitude;

a heating device for heating a wafer supported on the wafer support table of the wafer support device;

a process gas supply unit for supplying process gases toward a wafer supported on the wafer support table;

a carrying means for carrying a wafer into the processing chamber and transferring the wafer to the wafer support table;

a heat shielding member for covering at least a surface of a wafer facing the heating device and for moving together with the carrying means while the wafer is carried in the processing chamber by the carrying means before processing.

24. A substrate treatment system comprising:

a vessel defining a processing chamber;

a wafer support device disposed in the processing chamber and having a wafer support table for supporting a wafer thereon;

a process gas supply unit for supplying process gases toward a wafer supported on the wafer support table of the wafer support device;

a heating device disposed outside the vessel so as to be opposite to at least either one or the other of major surfaces of a wafer supported on the wafer support table of the wafer support device to heat the wafer by radiation heat;

a quartz window disposed between a wafer supported on the wafer support table and the heating device, incorporated into the vessel and curved so as to be convex away from the wafer supported on the wafer support table; and means for performing a heat-treatment on a wafer supported on the wafer support table in a vacuum atmosphere created by evacuating the processing chamber defined by the vessel.

25. A substrate treatment system comprising:

a vessel defining a processing chamber;

a wafer support device disposed in the processing chamber, and having a wafer support table for supporting a wafer thereon;

a process gas supply unit for supplying process gases toward a wafer supported on the wafer support table of the wafer support device;

a heating device disposed outside the vessel so as to be opposite to at least either one or the other of major surfaces of a wafer supported on the wafer support table of the wafer support device to heat the wafer by radiation heat;

a window disposed between a wafer supported on the wafer support table and the heating device, incorporated into the vessel and curved so as to be convex toward a wafer supported on the wafer support table;

means for performing a heat-treatment on a wafer supported on the wafer support table in a pressurized atmosphere created in the processing chamber defined by the vessel.

26. A gas-processing system comprising:

a vessel defining a processing chamber and having a side wall formed with an opening through which a wafer is carried into and carried out of the processing chamber;

a wafer support device disposed in the processing chamber, and having a wafer support table for supporting a wafer thereon in a substantially horizontal attitude; and a gas supply/exhaust unit disposed opposite to a surface to be treated of a wafer supported on the wafer support table to supply and exhaust process gases;

wherein the gas supply/exhaust unit has a plurality of gas flow regions, including gas flow regions serving as gas supply regions and other gas flow regions serving as gas exhaust regions, the function of the gas flow regions serving as the gas supply regions and the other regions serving as the gas exhaust regions are replaced with each other to change the flow of process gases during heat-treatment.

27. A gas-treatment system comprising:

a vessel defining a processing chamber;

a wafer support device disposed in the processing chamber defined by the vessel, and having a wafer support table for supporting a wafer thereon; and a gas supply unit disposed opposite to the wafer support table and provided with a plurality of gas supply openings to supply process gases toward a wafer supported on the wafer support table;

wherein process gasses are supplied through the gas supply openings corresponding to a radially outer region of a surface of a wafer supported on the wafer support table of the wafer support device at a flow rate lower than that at which the process gases are supplied through the gas supply openings corresponding to a radially inner regions of the surface of the wafer supported on the wafer support table.

* * * * *